(12) United States Patent
Antonyan

(10) Patent No.: US 9,378,797 B2
(45) Date of Patent: Jun. 28, 2016

(54) PROVIDE A MEMORY DEVICE CAPABLE OF INCREASING PERFORMANCE BY PERFORMING A WRITE OPERATION USING STABLE MULTI VOLTAGES THAT ARE APPLIED TO A WORD LINE

(71) Applicant: Artur Antonyan, Suwon-si (KR)

(72) Inventor: Artur Antonyan, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/751,112

(22) Filed: Jun. 25, 2015

(65) Prior Publication Data

US 2016/0035403 A1  Feb. 4, 2016

(30) Foreign Application Priority Data

Jul. 31, 2014  (KR) .................. 10-2014-0097915

(51) Int. Cl.
*G11C 11/16*  (2006.01)

(52) U.S. Cl.
CPC ........ *G11C 11/1675* (2013.01); *G11C 11/1697* (2013.01)

(58) Field of Classification Search
CPC . G11C 11/1675; G11C 11/1697; G11C 11/16
USPC ......... 365/46, 66, 74, 97, 100, 145, 158, 163, 365/171, 173, 189.07, 207
See application file for complete search history.

(56) References Cited

U.S. PATENT DOCUMENTS

| 7,016,220 | B2 * | 3/2006 | Lee ........................ | G11C 11/14 365/158 |
| 7,145,824 | B2 * | 12/2006 | Bill ........................ | B82Y 10/00 365/148 |
| 7,511,992 | B2 * | 3/2009 | Ueda ...................... | G11C 11/16 365/158 |
| 7,742,329 | B2 | 6/2010 | Yoon et al. | |
| 7,986,572 | B2 | 7/2011 | Yang | |
| 8,018,758 | B2 | 9/2011 | Yang | |
| 8,027,206 | B2 | 9/2011 | Yoon et al. | |
| 8,059,480 | B2 * | 11/2011 | Lee ........................ | G11C 5/147 365/189.08 |
| 8,320,167 | B2 | 11/2012 | Rao et al. | |
| 8,498,144 | B2 | 7/2013 | Takahashi et al. | |

(Continued)

FOREIGN PATENT DOCUMENTS

| KR | 101093889 B1 | 12/2011 |
| KR | 101317448 B1 | 10/2013 |

*Primary Examiner* — Tha-O H Bui
(74) *Attorney, Agent, or Firm* — Renaissance IP Law Group LLP

(57) ABSTRACT

A voltage generator comprises a reference voltage providing unit, a comparison voltage providing unit and a comparison unit. The reference voltage providing unit comprises a reference element and a current source series-connected between a power supply voltage and a ground voltage, and outputs a reference voltage through a reference voltage node, which couples the reference element to the current source. The comparison voltage providing unit comprises a magnetic tunnel junction unit coupled between the power supply voltage and a comparison voltage node, and a transistor switch unit coupled between the ground voltage and the comparison voltage node. The comparison unit provides a write voltage to the transistor switch unit by comparing the reference voltage and the comparison voltage. The voltage generator according to example embodiments may increase the performance of the memory device by performing the write operation using stable multi voltages that are applied to a word line.

20 Claims, 21 Drawing Sheets

(56) References Cited

U.S. PATENT DOCUMENTS

| | | |
|---|---|---|
| 8,625,338 B2 | 1/2014 | Zhu et al. |
| 2004/0017721 A1 | 1/2004 | Schwabe et al. |
| 2007/0206417 A1 | 9/2007 | Fong et al. |
| 2008/0219043 A1 | 9/2008 | Yoon et al. |
| 2010/0195376 A1 | 8/2010 | Yoon et al. |
| 2010/0246250 A1* | 9/2010 | Chen ................. G11C 7/08 365/171 |
| 2011/0157971 A1* | 6/2011 | Kim .................. G11C 11/16 365/171 |
| 2012/0257444 A1 | 10/2012 | Oh |
| 2013/0128658 A1 | 5/2013 | Alam et al. |
| 2013/0182499 A1 | 7/2013 | Prejbeanu et al. |
| 2013/0215675 A1 | 8/2013 | Ryu et al. |

* cited by examiner

PROVIDE A MEMORY DEVICE CAPABLE OF INCREASING PERFORMANCE BY PERFORMING A WRITE OPERATION USING STABLE MULTI VOLTAGES THAT ARE APPLIED TO A WORD LINE

CROSS-REFERENCE TO RELATED APPLICATION

This application claims priority under 35 U.S.C. §119 to Korean Patent Application No. 10-2014-0097915, filed on Jul. 31, 2014, in the Korean Intellectual Property Office (KIPO), the contents of which are herein incorporated by reference in their entirety.

BACKGROUND

Example embodiments relate generally to a memory device and more particularly to a voltage generator and a memory device including the voltage generator.

Magnetic random access memory (MRAM) is a non-volatile memory such that data written in the memory cells are retained even after power to the memory cells is off. The MRAM is also a resistive memory such that the value of data stored in the memory cell is based on the resistance of the memory cell. Particularly among the various resistive memories, the write operation and the read operation of the MRAM cell may be performed depending on a current direction and a current amount.

To be a substitute for the widely used DRAM, an MRAM requires increase in the speed of the write operation and the read operation in order to be comparable to the speed of the operations of a DRAM.

SUMMARY

Some example embodiments provide a voltage generator capable of increasing performance by performing a write operation using stable multi voltages that are applied to a word line.

Some example embodiments provide a memory device capable of increasing performance by performing a write operation using stable multi voltages that are applied to a word line.

According to example embodiments, a voltage generator comprises a reference voltage providing unit, a comparison voltage providing unit and a comparison unit. The reference voltage providing unit comprises a reference element and a current source series-connected between a power supply voltage and a ground voltage. The reference voltage providing unit outputs a reference voltage through a reference voltage node. The reference voltage node couples the reference element to the current source. The comparison voltage providing unit comprises a magnetic tunnel junction unit coupled between the power supply voltage and a comparison voltage node and a transistor switch unit coupled between the ground voltage and the comparison voltage node. The comparison voltage providing unit outputs a comparison voltage through the comparison voltage node. The comparison unit provides a write voltage to the transistor switch unit by comparing the reference voltage and the comparison voltage.

An amplitude of the current between the magnetic tunnel junction unit and the transistor switch unit may be determined based on an amplitude of the current of the current source.

The magnetic tunnel junction unit may include a plurality of magnetic tunnel junction elements each coupled between the power supply voltage and the comparison voltage node.

The transistor switch unit may comprise a plurality of transistor switches connected between the ground voltage and the comparison voltage node.

The voltage generator may further comprise control switches that selectively couple the magnetic tunnel junction elements and the transistor switches to the comparison voltage node.

The control switches may be controlled based on temperature.

An amplitude of the current between the magnetic tunnel junction unit and the transistor switch unit may be less than an amplitude of a breakdown current of the magnetic junction elements.

A magnetic tunnel junction element included in the magnetic tunnel junction unit may be precharged as a first state where spin directions of a first layer and a third layer included in the magnetic tunnel junction element are same.

The reference element may be one of a resistor element, a magnetic tunnel junction element and a voltage source.

The reference voltage may be determined based on an amplitude of a current of the current source.

The reference voltage may be increased as the amplitude of the current of the current source is decreased. The reference voltage may be decreased as the amplitude of the current of the current source is increased.

The write voltage may be changed as the reference voltage is changed.

A voltage generator comprises a reference voltage providing unit, a comparison voltage providing unit and a comparison unit. The reference voltage providing unit comprises a current source coupled between a power supply voltage and a reference voltage node and a reference element coupled between the reference voltage node and a ground voltage. The reference voltage providing unit outputs a reference voltage through the reference voltage node. The comparison voltage providing unit comprises a transistor switch unit coupled between the power supply voltage and a comparison voltage node and a magnetic tunnel junction unit coupled between the ground voltage and the comparison voltage node. The comparison voltage providing unit outputs a comparison voltage through the comparison voltage node. The comparison unit provides a write voltage to the transistor switch unit by comparing the reference voltage and the comparison voltage.

An amplitude of the current between the magnetic tunnel junction unit and the transistor switch unit may be determined based on an amplitude of the current of the current source.

The magnetic tunnel junction unit may comprise a plurality of magnetic tunnel junction elements coupled between the ground voltage and the comparison voltage node. The transistor switch unit may comprise a plurality of transistor switches coupled between the power supply voltage and the comparison voltage node. Control switches may selectively couple the magnetic tunnel junction elements and the transistor switches to the comparison voltage node.

An amplitude of the current between the magnetic tunnel junction unit and the transistor switch unit may be less than an amplitude of a breakdown current of the magnetic junction elements.

A magnetic tunnel junction element included in the magnetic tunnel junction unit is precharged as a second state where spin directions of a first layer and a third layer included in the magnetic tunnel junction element are different.

A memory device comprises a memory cell array and a write voltage generating unit. The write voltage providing unit comprises a first write voltage providing unit and a second write voltage providing unit. The memory cell array comprises memory cells that are coupled between a plurality of bit lines and a plurality of source lines. Each of the memory cells comprises a switch transistor where a local word line is connected to gate. The write voltage generating unit provides a first write voltage or a second write voltage to a corresponding local word line when a global word line is enabled. The first write voltage is output from a first write voltage providing unit. The second write voltage is output from a second write voltage providing unit. The first write voltage providing unit comprises a first reference voltage providing unit, a first comparison voltage providing unit and a first comparison unit. The second write voltage providing unit comprises a second reference voltage providing unit, a second comparison voltage providing unit and a second comparison unit. The first reference voltage providing unit may comprise a first reference element and a first current source coupled in series between a power supply voltage and a ground voltage. The first reference voltage providing unit outputs a first reference voltage through a first reference voltage node. The first reference voltage node couples the first reference element to the first current source. The first comparison voltage providing unit comprises a first magnetic tunnel junction unit coupled between the power supply voltage and a first comparison voltage node and a first transistor switch unit coupled between the ground voltage and the first comparison voltage node. The first comparison voltage providing unit outputs a first comparison voltage through the first comparison voltage node. The first comparison unit provides a first write voltage to the first transistor switch unit by comparing the first reference voltage and the first comparison voltage. The second reference voltage providing unit comprises a second current source coupled between a power supply voltage and a second reference voltage node and a second reference element coupled between the second reference voltage node and a ground voltage. The second reference voltage providing unit outputs a second reference voltage through the second reference voltage node. The second comparison voltage providing unit comprises a second transistor switch unit coupled between the power supply voltage and a second comparison voltage node and a second magnetic tunnel junction unit coupled between the ground voltage and the second comparison voltage node. The second comparison voltage providing unit outputs a second comparison voltage through the second comparison voltage node. The second comparison unit provides a second write voltage to the second transistor switch unit by comparing the second reference voltage and the second comparison voltage.

In the case that the memory cell is written from a first state to a second state, the write voltage providing unit may output the first write voltage. In the case that the memory cell is written from the second state to the first state, the write voltage providing unit may output the second write voltage.

The memory device may further comprise a precharge unit that precharges the first magnetic tunnel junction unit and the second magnetic tunnel junction unit.

Transistor switches included in the first transistor switch unit and the second transistor switch unit may be n-mos transistors or p-mos transistors. A magnetic tunnel junction element included in a memory cell may be substantially identical with a magnetic junction element included in the first magnetic tunnel junction unit and the second magnetic tunnel junction unit. A transistor switch included in the memory cell may be substantially identical with a transistor switch included in the first transistor switch unit and the second transistor switch unit.

The voltage generator according to example embodiments may increase the performance of the memory device by performing the write operation using stable multi voltages that are applied to the word line.

Some example embodiments provide an electronic system, comprising a processor, and a memory coupled to the processor. In some example embodiments, the electronic system may further comprise a touch-screen display coupled to the processor. In example embodiments, the memory may comprise a voltage generator. In example embodiments, the voltage generator may comprise a reference-voltage providing unit, a comparison voltage providing unit, and a comparison unit.

In example embodiments, the reference voltage providing unit may comprise a reference element and a current source. The reference element and the current source may be coupled in series between a power supply voltage and a ground voltage. The reference voltage providing unit may be configured to output a reference voltage through a reference voltage node.

In example embodiments, the comparison voltage providing unit may be coupled to the reference voltage node. The comparison-voltage providing unit may comprise a magnetic tunnel junction unit and a transistor switch unit. The magnetic tunnel junction may be coupled between the power supply voltage and a comparison voltage node and the transistor switch unit may be coupled between the ground voltage and the comparison voltage node. The comparison voltage providing unit may be configured to output a comparison voltage through the comparison voltage node.

In example embodiments, the comparison unit may be configured to provide a write voltage to the transistor switch unit by comparing the reference voltage and the comparison voltage.

In example embodiments, an amplitude of a current between the magnetic tunnel junction unit and the transistor switch unit may be determined based on an amplitude of a current of the current source.

In example embodiments, the magnetic tunnel junction unit may comprise a plurality of magnetic tunnel junction elements each coupled between the power supply voltage and the comparison voltage node. The transistor switch unit may comprise a plurality of transistor switches each coupled between the ground voltage and the comparison voltage node.

In example embodiments, the voltage generator may further comprise control switches that selectively couple the magnetic tunnel junction elements and the transistor switches to the comparison voltage node. In example embodiments, the control switches may be controlled based on temperature. In example embodiments, an amplitude of the current between the magnetic tunnel junction unit and the transistor switch unit may be less than an amplitude of a breakdown current of the magnetic junction elements. In example embodiments, a magnetic tunnel junction element that is included in the magnetic tunnel junction unit may be precharged as a first state comprising spin directions of a first layer and a third layer of the magnetic tunnel junction element may be a same spin direction. In example embodiments, the reference element may comprise one of a resistor element, a magnetic tunnel junction element or a voltage source.

Example embodiments provide an electronic system comprising a processor, and a memory coupled to the processor. In some example embodiments, the electronic system may comprise a touch-screen display coupled to the processor. In example embodiments, the memory may comprise a memory cell array. In example embodiments, the memory cell array may comprise a plurality of memory cells, and a write voltage generating unit. The write voltage generating unit may be configured to provide a first write voltage or a second write voltage to a corresponding local word line when a global word line of the memory is enabled. The first write voltage may be output from a first write voltage providing unit, and the second write voltage may be output from a second write voltage providing unit.

In example embodiments, the first write voltage providing unit may comprise a first reference voltage and a first comparison unit. The first reference voltage providing unit may comprise a first reference element and a first current source. The first reference element and the first current source may be series-connected between a power supply voltage and a ground voltage. The first reference-voltage providing unit may be configured to output a first reference voltage through a first reference voltage node, and the first reference voltage node may connect the first reference element to the first current source.

In example embodiments, the first comparison voltage providing unit may comprise a first magnetic tunnel junction unit and a first transistor switch unit. The first magnetic tunnel junction unit may be coupled between the power supply voltage and a first comparison voltage node. The first transistor switch unit may be coupled between the ground voltage and the first comparison voltage node, and the first comparison voltage providing unit may be configured to output a first comparison voltage through the first comparison voltage node. The first comparison unit may be configured to provide a first write voltage to the first transistor switch unit by comparing the first reference voltage and the first comparison voltage.

In example embodiments, the second write voltage providing unit may comprise a second reference voltage providing unit and a second comparison unit. The second reference voltage providing unit may comprise a second current source and a second reference element. The second current source may be coupled between a power supply voltage and a second reference voltage node. The second reference element may be coupled between the second reference voltage node and a ground voltage, and the second reference voltage providing unit may be configured to output a second reference voltage through the second reference voltage node.

In example embodiments, the second comparison voltage providing unit may comprise a second transistor switch unit and a second magnetic tunnel junction unit. The second transistor switch unit may be coupled between the power supply voltage and a second comparison voltage node. The second magnetic tunnel junction unit may be coupled between the ground voltage and the second comparison voltage node, and the second comparison voltage providing unit may be configured to output a second comparison voltage through the second comparison voltage node.

In example embodiments, the second comparison unit may be configured to provide a second write voltage to the second transistor switch unit by comparing the second reference voltage and the second comparison voltage.

In example embodiments, in a case in which a memory cell is written from a first state to a second state, the write voltage providing unit may output the first write voltage, and in a case in which the memory cell is written from the second state to the first state, the write voltage providing unit may output the second write voltage.

In example embodiments, the memory may further comprise a precharge unit that precharges the first magnetic tunnel junction unit and the second magnetic tunnel junction unit.

In example embodiments, the transistor switches included in the first transistor switch unit and the second transistor switch unit may be n-mos transistors or p-mos transistors. In example embodiments, a magnetic tunnel junction element included in a memory cell may be substantially identical with the magnetic junction element included in the first magnetic tunnel junction unit and the second magnetic tunnel junction unit. In example embodiments, a transistor switch included in the memory cell may be substantially identical with a transistor switch included in the first transistor switch unit and the second transistor switch unit.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
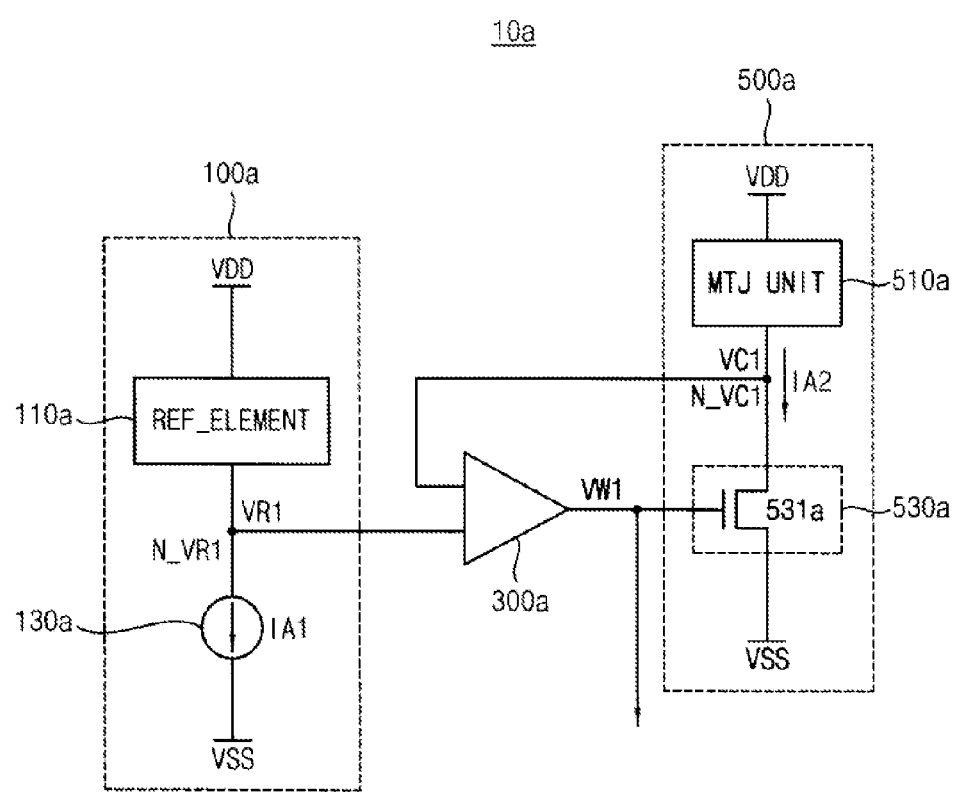
FIG. 1 is a block diagram illustrating a voltage generator according to example embodiments.

Various example embodiments will be described more fully hereinafter with reference to the accompanying drawings, in which some example embodiments are shown. The subject matter disclosed herein may, however, be embodied in many different forms and should not be construed as limited to the example embodiments set forth herein. Rather, these example embodiments are provided so that this disclosure will be thorough and complete, and will fully convey the scope of the claimed subject matter to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which the disclosed subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a voltage generator according to example embodiments.

Referring to FIG. 1, a voltage generator 10a includes a reference voltage providing unit 100a, a comparison voltage providing unit 500a and a comparison unit 300a. The reference voltage providing unit 100a includes a reference element 110a and a current source 130a series-connected between a power supply voltage VDD and a ground voltage VSS. For example, the reference element 110a may be connected between the power supply voltage VDD and a reference voltage node N_VR1. The current source 130a may be connected between the reference voltage VR1 and the ground voltage VSS.

The reference voltage providing unit 100a outputs a reference voltage VR1 through a reference voltage node N_VR1. For example, the reference element 110a may be a resistor element R. In the case that the amplitude of the current provided from the current source 130a is constant, as the resistance value of the resistor element R increases, the reference voltage VR1 may decrease. Also, in the case that the amplitude of the current provided from the current source 130a is constant, as the resistance value of the resistor element R decreases, the reference voltage VR1 may increase. For example, in the case that the resistance value of the resistor element R is constant, as the amplitude of the current provided from the current source 130a increases, the reference voltage VR1 may decrease. Also in the case that the resistance value of the resistor element R is constant, as the amplitude of the current provided from the current source 130a decreases, the reference voltage VR1 may increase. For example, the resistance value of the resistor element R may be predetermined before the voltage generator 10a operates. The reference voltage node N_VR1 connects the reference element 110a to the current source 130a.

The comparison voltage providing unit 500a includes a magnetic tunnel junction unit 510a and a transistor switch unit 530a. The magnetic tunnel junction unit 510a may be connected between the power supply voltage VDD and a comparison voltage node N_VC1. The transistor switch unit 530a may be connected between the ground voltage VSS and the comparison voltage node N_VC1. The comparison voltage providing unit 500a outputs a comparison voltage VC1 through the comparison voltage node N_VC1. The comparison unit 300a provides a write voltage VW1 to the transistor switch unit 530a by comparing the reference voltage VR1 and the comparison voltage VC1.

For example, the reference voltage VR1 provided from the reference voltage providing unit 100a and the comparison voltage VC1 provided from the comparison voltage providing unit 500a may be inputs of the comparison unit 300a. The comparison unit 300a may provide the write voltage VW1 to the comparison voltage providing unit 500a by comparing the reference voltage VR1 and the comparison voltage VC1. In the case that the process, voltage and temperature are not changed, the reference voltage VR1 and the comparison voltage VC1 may be constant. In this case, the comparison voltage VC1 may be greater than the reference voltage VR1. If the reference voltage VR1 and the comparison voltage VC1 that are the inputs of the comparison unit 300a are constant, the write voltage VW1 that is the output of the comparison unit 300a may be constant. If the write voltage VW1 is constant, the constant write voltage VW1 may be provided to the transistor switch 531a included in the transistor switch unit 530a. If the constant write voltage VW1 is provided to the transistor switch 531a, the amplitude of the current between the magnetic tunnel junction unit 510a and the transistor switch unit 530a may be constant.

As time passes, the process, the voltage and the temperature may change. For example, the temperature of the system including the voltage generator 10a may increase. If the temperature of the system including the voltage generator 10a increases, the resistance value of the magnetic tunnel junction element of the magnetic tunnel junction unit 510a included in the voltage generator 10a may decrease and the amplitude of the current between the magnetic tunnel junction unit 510a and the transistor switch unit 530a may decrease. If the resistance value of the magnetic tunnel junction element decreases and the amplitude of the current between the magnetic tunnel junction unit 510a and the transistor switch unit 530a decreases, the comparison voltage VC1 may increase. If the comparison voltage VC1 increases, the voltage difference between the reference voltage VR1 and the comparison voltage VC1 may increase. If the voltage difference between the reference voltage VR1 and the comparison voltage VC1 increases, the write voltage VW1 may increase. In the case that the write voltage VW1 increases, a gate voltage of the transistor switch 531a included in the transistor switch unit 530a may increase. If the gate voltage of the transistor switch 531a increases, the amplitude of the current between the magnetic tunnel junction unit 510a and the transistor switch unit 530a may increase.

Therefore, if the temperature of the system including the voltage generator 10a increases, the amplitude of the current between the magnetic tunnel junction unit 510a and the transistor switch unit 530a may decrease. If the amplitude of the current between the magnetic tunnel junction unit 510a and the transistor switch unit 530a decreases, the amplitude of the current between the magnetic tunnel junction unit 510a and the transistor switch unit 530a may increase as the voltage generator 10a increases the write voltage VW1. In this case, the voltage generator 10a may maintain the constant amplitude of the current between the magnetic tunnel junction unit 510a and the transistor switch unit 530a regardless of the increase of the temperature.

As time passes, the process, the voltage and the temperature may change again. For example, the temperature of the system including the voltage generator 10a may decrease. If the temperature of the system including the voltage generator 10a decreases, the resistance value of the magnetic tunnel junction element of the magnetic tunnel junction unit 510a included in the voltage generator 10a may increase and the amplitude of the current between the magnetic tunnel junction unit 510a and the transistor switch unit 530a may increase. If the resistance value of the magnetic tunnel junction element increases and the amplitude of the current between the magnetic tunnel junction unit 510a and the transistor switch unit 530a is increased, the comparison voltage VC1 may decrease. If the comparison voltage VC1 decreases, the voltage difference between the reference voltage VR1 and the comparison voltage VC1 may decrease. If the voltage difference between the reference voltage VR1 and the comparison voltage VC1 is decreased, the write voltage VW1 may decrease. In the case that the write voltage VW1 is decreased, the gate voltage of the transistor switch 531a included in the transistor switch unit 530a may decrease. If the gate voltage of the transistor switch 531a is decreased, the amplitude of the current between the magnetic tunnel junction unit 510a and the transistor switch unit 530a may decrease.

Therefore, if the temperature of the system including the voltage generator 10a decreases, the amplitude of the current between the magnetic tunnel junction unit 510a and the transistor switch unit 530a may increase. If the amplitude of the current between the magnetic tunnel junction unit 510a and the transistor switch unit 530a increases, the amplitude of the current between the magnetic tunnel junction unit 510a and the transistor switch unit 530a may decrease as the voltage generator 10a decreases the write voltage VW1. In this case, the voltage generator 10a may maintain the constant amplitude of the current between the magnetic tunnel junction unit 510a and the transistor switch unit 530a regardless of the decrease of the temperature.

If the voltage generator 10a according to example embodiments is used, the amplitude of the current between the magnetic tunnel junction unit 510a and the transistor switch unit 530a may maintain a constant value regardless of the process, the voltage and the temperature.

As will be described referring to FIG. 21, the voltage generator 10a may provide a voltage to a word line included in the memory device. In the case that the current that is greater than a predetermined amount of current is transferred to the magnetic tunnel junction element, the magnetic tunnel junction element may break down. The amplitude of the current at which the magnetic tunnel junction element breaks down may be a breakdown current. To prevent the breakdown of the memory cell, a constant amplitude of the current that is less than the breakdown current may be transferred to the magnetic tunnel junction element. The voltage generator 10a may be used to provide the constant amplitude of the current that is less than the breakdown current to the magnetic tunnel junction element.

For example, the magnetic tunnel junction element included in the voltage generator 10a may be identical to the magnetic tunnel junction element included in the memory cell. The transistor switch 531a of the transistor switch unit 530a included in the voltage generator 10a may be identical to the transistor switch included in the memory cell. In this case, the write voltage VW1 may be transferred to the gate of the transistor switch included in the memory cell. The comparison voltage providing unit 500a may be identical to the memory cell. Therefore, the amplitude of the current between the magnetic tunnel junction element included in the voltage generator 10a and the transistor switch 531a included in the voltage generator 10a may be identical to the amplitude of the current between the magnetic tunnel junction element included in the memory cell and the transistor switch included in the memory cell.

If the voltage generator 10a according to example embodiments is used, the amplitude of the current between the magnetic tunnel junction unit 510a included in the voltage generator 10a and the transistor switch unit 530a included in the voltage generator 10a may be constant regardless of the process, the voltage and the temperature. If the amplitude of the current between the magnetic tunnel junction unit 510a included in the voltage generator 10a and the transistor switch unit 530a included in the voltage generator 10a is constant, the amplitude of the current between the magnetic tunnel junction element included in the memory cell and the transistor switch included in the memory cell may be constant. Therefore, if the voltage generator 10a according to example embodiments is used, a constant amplitude of the current that is less than the breakdown current may be transferred to the magnetic tunnel junction element. If a constant amplitude of the current that is less than the breakdown current is transferred to the magnetic tunnel junction element, the breakdown of the memory cell may be prevented.

In an example embodiment, the reference element 110a may be connected between the power supply voltage VDD and the reference voltage node N_VR1. The current source 130a may be connected between the reference voltage node N_VR1 and the ground voltage VSS.

In an example embodiment, the amplitude of the current between the magnetic tunnel junction unit 510a and the transistor switch unit 530a may be determined based on the amplitude of the current of the current source 130a. For example, the reference element 110a may be resistor element R. In the case that the resistance value of the resistor element R is constant, as the amplitude of the current provided from the current source 130a increases, the reference voltage VR1 may decrease. Also, in the case that the resistance value of the resistor element R is constant, as the amplitude of the current provided from the current source 130a decreases, the reference voltage VR1 may increase.

If the reference voltage VR1 changes, the voltage difference between the reference voltage VR1 and the comparison voltage VC1 may change. If the voltage difference between the reference voltage VR1 and the comparison voltage VC1 changes, the write voltage VW1 that is the output of the comparison unit 300a may change. If the write voltage VW1 changes, the gate voltage of the transistor switch 531a included in the transistor switch unit 530a may change. If the gate voltage of the transistor switch changes, the amplitude of the current between the magnetic tunnel junction unit 510a and the transistor switch unit 530a may change.

For example, the comparison voltage VC1 may be greater than the reference voltage VR1. If the amplitude of the current provided from the current source 130a increases, the reference voltage VR1 may decrease. If the reference voltage VR1 decreases, the voltage difference between the reference voltage VR1 and the comparison voltage VC1 may increase. If the voltage difference between the reference voltage VR1 and the comparison voltage VC1 increases, the write voltage VW1 that is the output of the comparison unit 300a may increase. In the case that the write voltage VW1 increases, the gate voltage of the transistor switch 531a included in the transistor switch unit 530a may increase. If the gate voltage of the transistor switch is increases, the amplitude of the current between the magnetic tunnel junction unit 510a and the transistor switch unit 530a may increase. Therefore, if the amplitude of the current of the current source 130a increases, the amplitude of the current between the magnetic tunnel junction unit 510a and the transistor switch unit 530a may increase.

As time passes, the amplitude of the current provided from the current source 130a may decrease. If the amplitude of the current provided from the current source 130a decreases, the reference voltage VR1 may increase. If the reference voltage VR1 increases, the voltage difference between the reference voltage VR1 and the comparison voltage VC1 may decrease. If the voltage difference between the reference voltage VR1 and the comparison voltage VC1 is decreases, the write voltage VW1 that is the output of the comparison unit 300a may decrease. In the case that the write voltage VW1 decreases, the gate voltage of the transistor switch 531a included in the transistor switch unit 530a may decrease. If the gate voltage of the transistor switch 531a decreases, the amplitude of the current between the magnetic tunnel junction unit 510a and the transistor switch unit 530a may decrease. Therefore, if the amplitude of the current of the current source 130a decreases, the amplitude of the current between the magnetic tunnel junction unit 510a and the transistor switch unit 530a may decrease.

Figure 2:
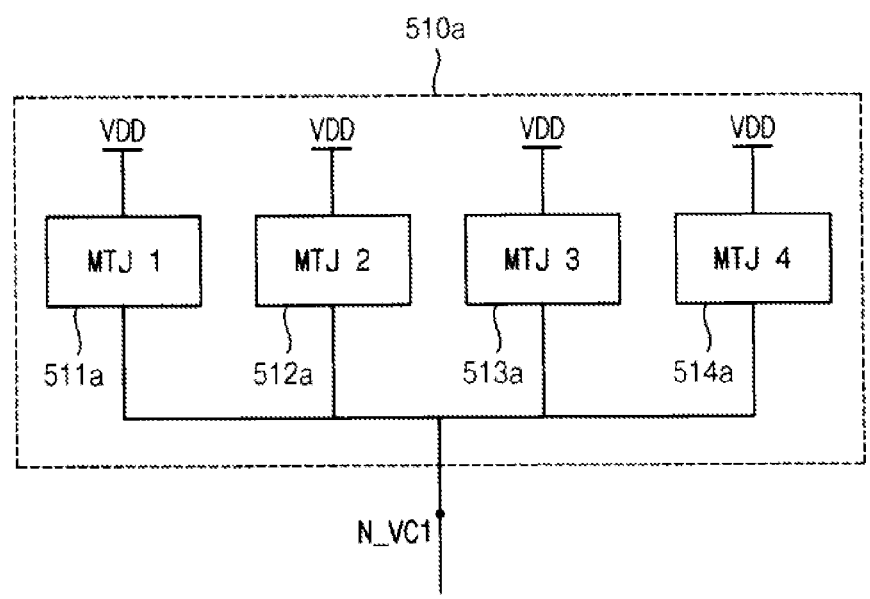
FIG. 2 is a block diagram illustrating an example of a magnetic tunnel junction unit included in the voltage generator of FIG. 1.
Figure 3:
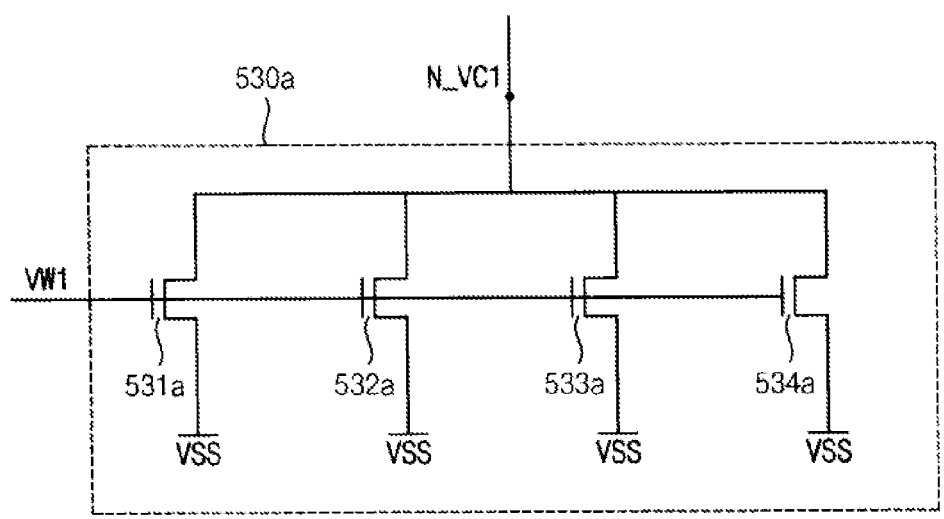
FIG. 3 is a block diagram illustrating an example of a transistor switch unit included in the voltage generator of FIG. 1.

FIG. 2 is a block diagram illustrating an example of a magnetic tunnel junction unit included in the voltage generator of FIG. 1, and FIG. 3 is a block diagram illustrating an example of a transistor switch unit included in the voltage generator of FIG. 1.

Referring to FIGS. 2 and 3, the magnetic tunnel junction unit 510a may include a plurality of magnetic tunnel junction elements 511a to 514a connected between the power supply voltage VDD and the comparison voltage node N_VC1. The transistor switch unit 530a may include a plurality of transistor switches 531a to 534a connected between the ground voltage VSS and the comparison voltage node N_VC1. The magnetic tunnel junction unit 510a may include a first to fourth magnetic tunnel junction element 511a to 514a. The voltage generator 10a according to example embodiments may provide the voltage to the word line included in the memory device. To prevent the breakdown of the memory cell, a constant amplitude of the current that is less than the breakdown current may be transferred to the magnetic tunnel junction element. The voltage generator 10a may be used to provide a constant amplitude of the current that is less than the breakdown current to the magnetic tunnel junction element.

For example, the magnetic tunnel junction element included in the voltage generator 10a may be identical to the magnetic tunnel junction element included in the memory cell. The write voltage VW1 may be transferred to the gate of the transistor switch included in the memory cell. In this case, the comparison voltage providing unit 500a may be identical to the memory cell. Therefore, the amplitude of the current between the magnetic tunnel junction element included in the voltage generator 10a and the transistor switch 531a included in the voltage generator 10a may be identical to the amplitude of the current between the magnetic tunnel junction element included in the memory cell and the transistor switch included in the memory cell.

The plurality of magnetic tunnel junction elements 511a to 514a may be used so that the magnetic tunnel junction unit 510a is identical to the magnetic tunnel junction element included in the memory cell. For example, the resistance value of the magnetic tunnel junction unit 510a included in the voltage generator 10a may be different from the resistance value of the magnetic tunnel junction element included in the memory cell. In the case that the resistance value of the magnetic tunnel junction unit 510a included in the voltage generator 10a is different from the resistance value of the magnetic tunnel junction element included in the memory cell, the amplitude of the current between the magnetic tunnel junction unit 510a included in the voltage generator 10a and the transistor switch unit 530a included in the voltage generator 10a may be different from the amplitude of the current between the magnetic tunnel junction element included in the memory cell and the transistor switch included in the memory cell. Therefore, the resistance value of the magnetic tunnel junction unit 510a included in the voltage generator 10a should be identical to the resistance value of the magnetic tunnel junction element included in the memory cell. The plurality of magnetic tunnel junction elements 511a to 514a may be used so that the resistance value of the magnetic tunnel junction unit 510a is identical to the resistance value of the magnetic tunnel junction element included in the memory cell. For example, in the case that the first magnetic tunnel junction element 511a, the second magnetic tunnel junction element 512a, the third magnetic tunnel junction element 513a and the fourth magnetic tunnel junction element 514a are connected in parallel, the resistance value of the magnetic tunnel junction unit 510a included in the voltage generator 10a may be identical to the resistance value of the magnetic tunnel junction element included in the memory cell.

The transistor switch unit 530a may include a first to fourth transistor switch 534a. For example, the transistor switch 531a of the transistor switch unit 530a included in the voltage generator 10a may be identical to the transistor switch included in the memory cell. The write voltage VW1 may be transferred to the gate of the transistor switch included in the memory cell. In this case, the comparison voltage providing unit 500a may be identical to the memory cell. Therefore, the amplitude of the current between the magnetic tunnel junction unit 510a included in the voltage generator 10a and the transistor switch unit 530a included in the voltage generator 10a may be identical to the amplitude of the current between the magnetic tunnel junction element included in the memory cell and the transistor switch included in the memory cell.

The plurality of transistor switches 531a to 534a may be used so that the transistor switch unit 530a included in the voltage generator 10a is identical to the transistor switch included in the memory cell. For example, the resistance value of the transistor switch unit 530a included in the voltage generator 10a may be different from the resistance value of the transistor switch included in the memory cell. In the case that the resistance value of the transistor switch unit 530a included in the voltage generator 10a is different from the resistance value of the transistor switch included in the memory cell, the amplitude of the current between the magnetic tunnel junction unit 510a included in the voltage generator 10a and the transistor switch unit 530a included in the voltage generator 10a may be different from the amplitude of the current between the magnetic tunnel junction element included in the memory cell and the transistor switch included in the memory cell. Therefore, the resistance value of the transistor switch unit 530a included in the voltage generator 10a should be identical to the resistance value of the transistor switch included in the memory cell. The plurality of transistor switches 531a to 534a may be used so that the resistance value of the transistor switch unit 530a is identical to the resistance value of the transistor switch included in the memory cell. For example, in the case that the first transistor switch 531a, the second transistor switch 532a, the third transistor switch 533a and the fourth transistor switch 534a are connected in parallel, the resistance value of the transistor switch unit 530a included in the voltage generator 10a may be identical to the resistance value of the transistor switch included in the memory cell.

In an example embodiment, the write voltage VW1 may be applied to the gate of the plurality of the transistor switches.

Figure 4:
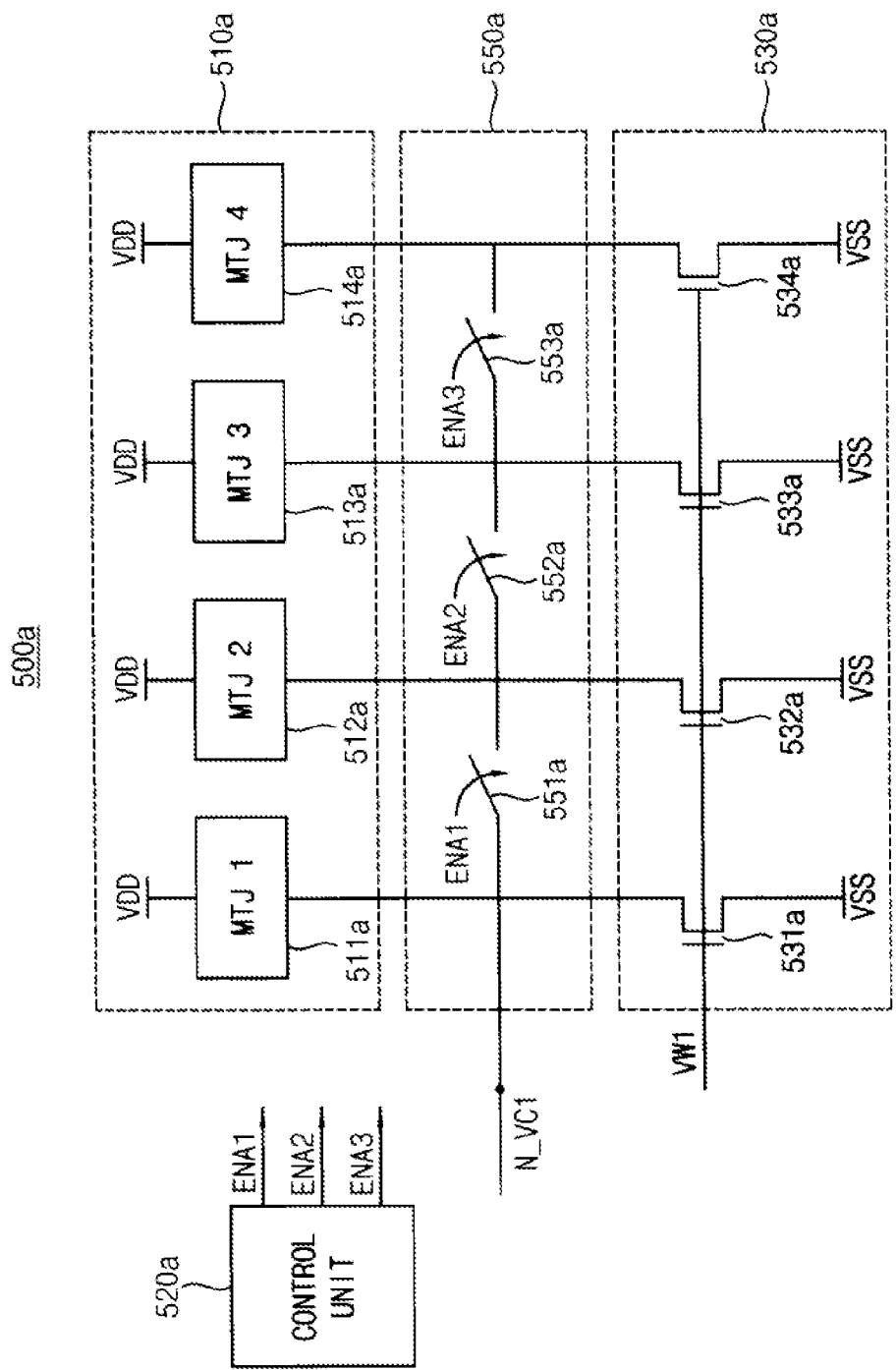
FIG. 4 is a block diagram illustrating an example of a comparison voltage providing unit included in the voltage generator of FIG. 1.

FIG. 4 is a block diagram illustrating an example of a comparison voltage providing unit included in the voltage generator of FIG. 1.

Referring to FIG. 4, the voltage generator 10a may further comprise control switches 551a to 553a that selectively connect the magnetic tunnel junction elements and the transistor switches to the comparison voltage node N_VC1. The magnetic tunnel junction unit 510a may include the first magnetic tunnel junction element 511a, the second magnetic tunnel junction element 512a, the third magnetic tunnel junction element 513a and the fourth magnetic tunnel junction element 514a. The transistor switch unit 530a may include the first transistor switch 531a, the second transistor switch 532a, the third transistor switch 533a and the fourth transistor switch 534a. The control switches may include a first control switch 551a, a second control switch 552a and a third control switch 553a. The resistance value of the magnetic tunnel junction unit 510a and the resistance value of the transistor switch unit 530a may be controlled by selecting the control switches.

For example, in the case that the first control switch 551a is turned-off, the first magnetic tunnel junction element 511a and the first transistor switch 531a may be connected to the comparison voltage node N_VC1 and the second magnetic tunnel junction element 512a, the third magnetic tunnel junction element 513a, the fourth magnetic tunnel junction element 514a, the second transistor switch 532a, the third transistor switch 533a and the fourth transistor switch 534a may not be connected to the comparison voltage node N_VC1. Also, in the case that the first control switch 551a is turned-on, the first magnetic tunnel junction element 511a the second magnetic tunnel junction element 512a, the first transistor switch 531a and the second transistor switch 532a may be connected to the comparison voltage node N_VC1 and the third magnetic tunnel junction element 513a, the fourth magnetic tunnel junction element 514a, the third transistor switch 533a and the fourth transistor switch 534a may not be connected to the comparison voltage node N_VC1. Also, in the case that the first control switch 551a and the second control switch 552a are turned-on, the first magnetic tunnel junction element 511a the second magnetic tunnel junction element 512a, the third magnetic tunnel junction element 513a, the first transistor switch 531a and the second transistor switch 532a and the third transistor switch 533a may be connected to the comparison voltage node N_VC1 and the fourth magnetic tunnel junction element 514a and the fourth transistor switch 534a may not be connected to the comparison voltage node N_VC1. Also, in the case that the first control switch 551a, the second control switch 552a and the third control switch 553a are turned-on, the first magnetic tunnel junction element 511a the second magnetic tunnel junction element 512a, the third magnetic tunnel junction element 513a, the fourth magnetic tunnel junction element 514a, the first transistor switch 531a, the second transistor switch 532a, the third transistor switch 533a and the fourth transistor switch 534a may be connected to the comparison voltage node N_VC1.

In an example embodiment, the control switches may be controlled based on temperature. For example, the control unit may provide a first enable signal ENA1, a second enable signal ENA2 and a third enable signal ENA3. The control unit may select the first control switch 551a, the second control switch 552a and the third control switch 553a by controlling the first enable signal ENA1 and the second enable signal ENA2 and the third enable signal ENA3.

Figure 5:
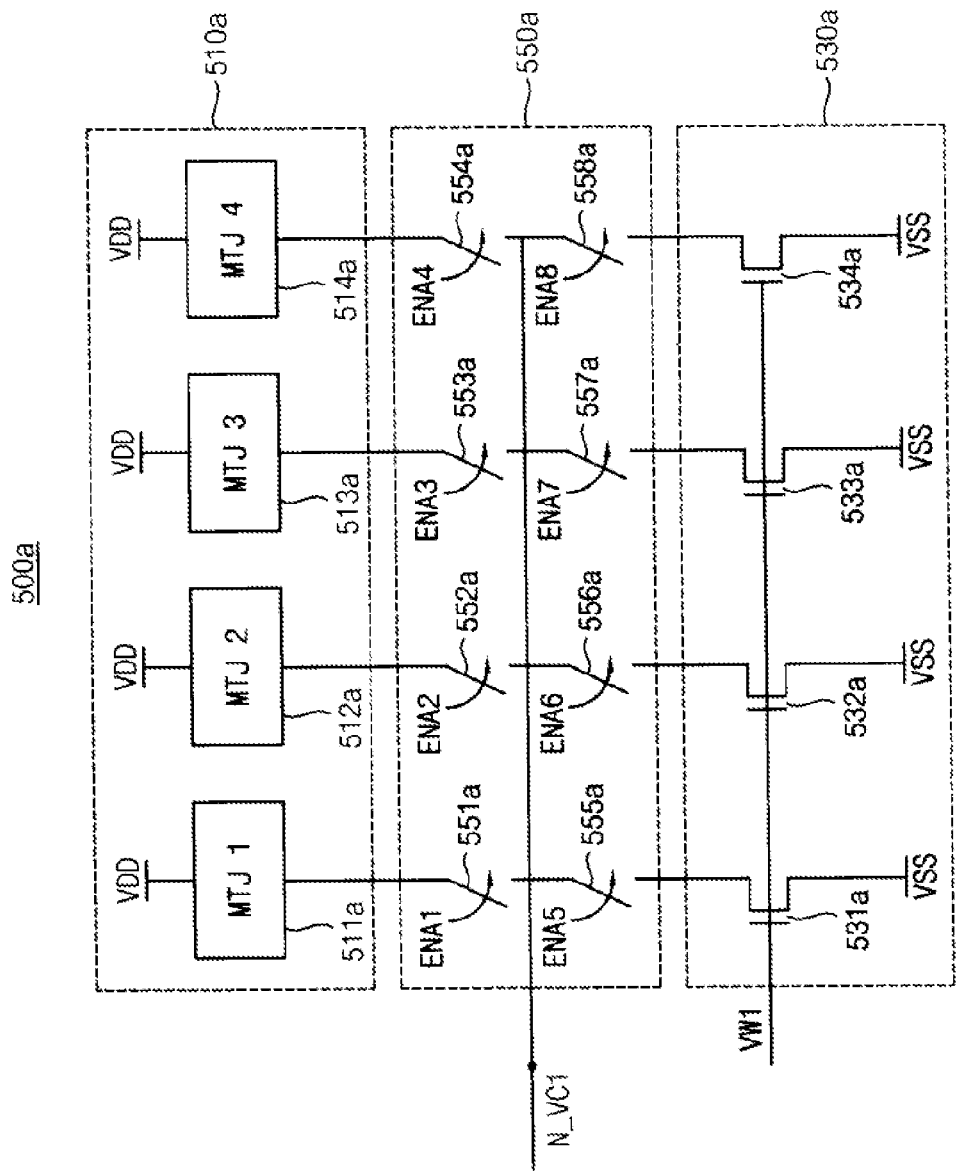
FIG. 5 is a block diagram illustrating another example of a comparison voltage providing unit included in the voltage generator of FIG. 1.

FIG. 5 is a block diagram illustrating another example of a comparison voltage providing unit included in the voltage generator of FIG. 1.

Referring to FIG. 5, the voltage generator 10a may include control switches that selectively connect the magnetic tunnel junction elements and the transistor switches to the comparison voltage node N_VC1. The magnetic tunnel junction unit 510a may include the first magnetic tunnel junction element 511a, the second magnetic tunnel junction element 512a, the third magnetic tunnel junction element 513a and the fourth magnetic tunnel junction element 514a. The transistor switch unit 530a may include the first transistor switch 531a, the second transistor switch 532a, the third transistor switch 533a and the fourth transistor switch 534a. The control switches may include a first to eighth control switch. The resistance value of the magnetic tunnel junction unit 510a and the resistance value of the transistor switch unit 530a may be controlled by selecting the control switches.

For example, in the case that the first control switch 551a and the fifth control switch 555a are turned-on, the first magnetic tunnel junction element 511a and the first transistor switch 531a may be connected to the comparison voltage node N_VC1. Also, in the case that the first control switch 551a, the second control switch 552a and the fifth control switch are turned-on, the first magnetic tunnel junction element 511a, the second magnetic tunnel junction element 512a and the first transistor switch 531a may be connected to the comparison voltage node N_VC1. Also, in the case that the first control switch 551a, the fourth control switch 554a and the fifth control switch 555a are turned-on, the first magnetic tunnel junction element 511a, the fourth magnetic tunnel junction element 514a and the first transistor switch 531a may be connected to the comparison voltage node N_VC1. Also, in the case that the first control switch 551a, the fifth control switch and the sixth control switch 556a are turned-on, the first magnetic tunnel junction element 511a, the first transistor switch 531a and the second transistor switch 532a may be connected to the comparison voltage node N_VC1. Also, in that case that the first control switch 551a, the fifth control switch and the seventh control switch 557a are turned-on, the first magnetic tunnel junction element 511a, the first transistor switch 531a and the third transistor switch 533a may be connected to the comparison voltage node N_VC1.

The first to fourth control switches 551a to 554a may be used to control the first to fourth magnetic tunnel junction elements 511a to 514a. The first to fourth control switches 551a to 554a may be controlled based on the first to fourth enable signals ENA1 to ENA4. If the first to fourth control switches 551a to 554a are controlled, the resistance value of the magnetic tunnel junction unit 510a may be controlled. The fifth to eighth control switches 555a to 558a may be used to control the first to fourth transistor switches 531a to 534a. The fifth to eighth control switches 555a to 558a may be controlled based on the fifth to eighth enable signals ENA5 to ENA8. If the fifth to eighth control switches 555a to 558a are controlled, the resistance value of the transistor switch unit 530a may be controlled.

Figure 6:
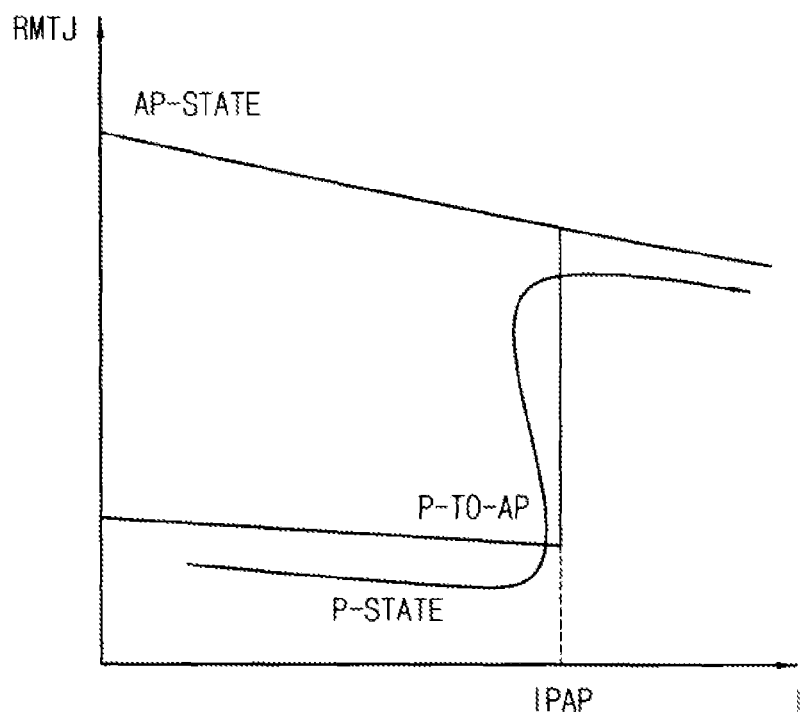
FIGS. 6 and 7 are diagrams for describing examples of write operation of a memory device including the voltage generator of FIG. 1.
Figure 7:
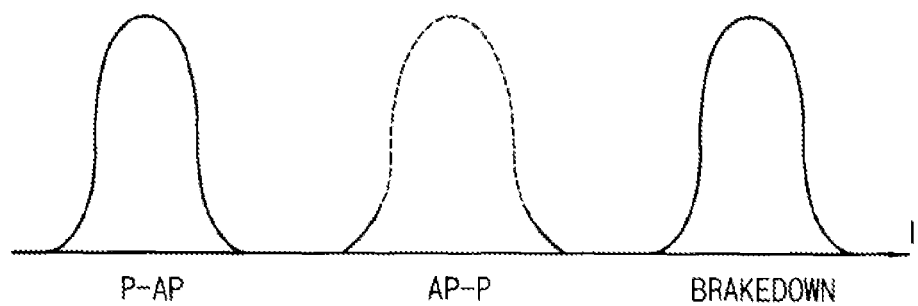
Figure 8:
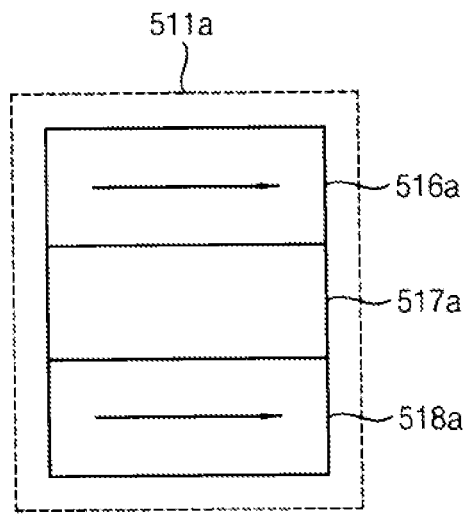
FIG. 8 is a diagram illustrating an example of a magnetic tunnel junction element included in the magnetic tunnel junction unit of FIG. 2.

FIGS. 6 and 7 are diagrams for describing examples of write operation of a memory device including the voltage generator of FIG. 1, and FIG. 8 is a diagram illustrating an example of a magnetic tunnel junction element included in the magnetic tunnel junction unit of FIG. 2.

Referring to FIGS. 6 to 8, an amplitude of the current between the magnetic tunnel junction unit 510a and the transistor switch unit 530a may be less than an amplitude of the breakdown current of the magnetic junction elements. The magnetic tunnel junction element 511a may include a first layer 516a, a second layer 517a and a third layer 518a. Spin directions of the first layer 516a and the third layer 518a included in the magnetic tunnel junction element may be the same based on the direction of current transferred to the magnetic tunnel junction element. A state in which the spin directions of the first layer 516a and the third layer 518a are the same may be a first state P-STATE. A state in which the spin directions of the first layer 516a and the third layer 518a are different may be a second state AP-STATE.

For example, to write the magnetic tunnel junction element from the first state P-STATE to the second state AP-STATE, the write current that is greater than a predetermined amount of current may be used. Also, to prevent the breakdown of the magnetic tunnel junction element, the amplitude of the write current may be less than the amplitude of the breakdown current. If the voltage generator 10a according to example embodiments is used, the amplitude of the current between the magnetic tunnel junction unit 510a included in the voltage generator 10a and the transistor switch unit 530a included in the voltage generator 10a may maintain a constant.

In an example embodiment, a magnetic tunnel junction element included in the magnetic tunnel junction unit 510a may be precharged as a first state P-STATE in which spin directions of a first layer 516a and a third layer 518a included in the magnetic tunnel junction element are same.

Figure 9:
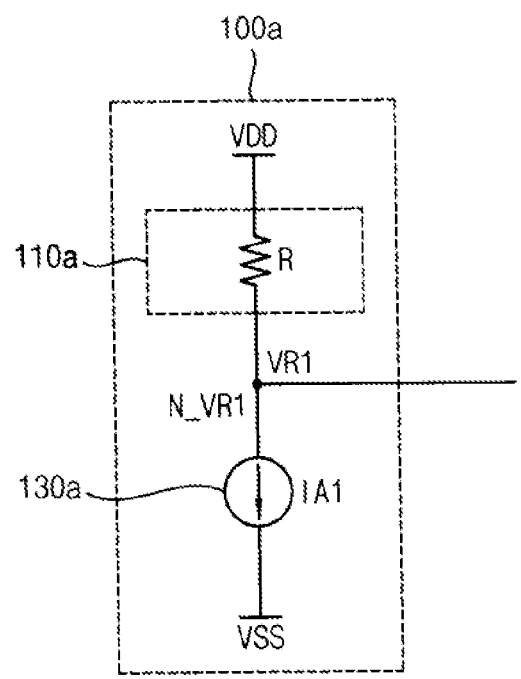
FIGS. 9 and 10 are block diagrams illustrating examples of a reference voltage providing unit included in the voltage generator of FIG. 1.
Figure 10:
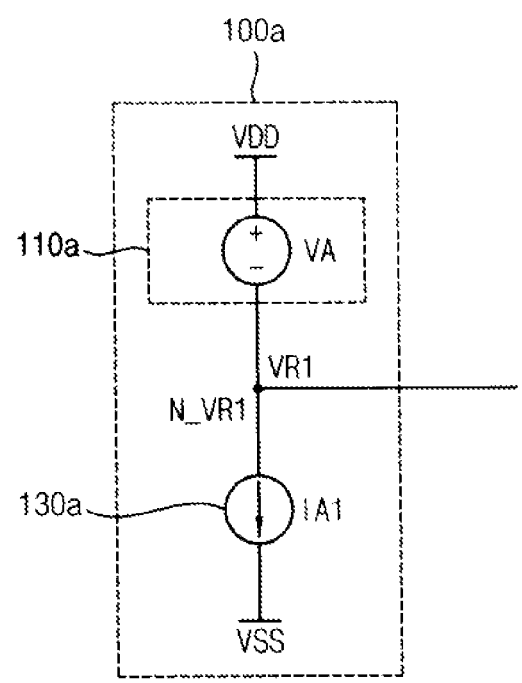

FIGS. 9 and 10 are block diagrams illustrating examples of a reference voltage providing unit included in the voltage generator of FIG. 1.

Referring to FIGS. 9 and 10, the reference voltage providing unit 100a may output a reference voltage VR1 through the reference voltage node N_VR1. The reference element 110a may be one of a resistor element R, a magnetic tunnel junction element and a voltage source VA.

For example, the reference element 110a may be the resistor element R. In the case that the amplitude of the current provided from the current source 130a is constant, as the resistance value of the resistor element R increases, the reference voltage VR1 may be decreased. Also, in the case that the amplitude of the current provided from the current source 130a is constant, as the resistance value of the resistor element R decreases, the reference voltage VR1 may increase. Therefore, the reference voltage VR1 may change based on the resistance value of the resistor element R.

For example, the reference element 110a may be the magnetic tunnel junction element. In the case that the amplitude of the current provided from the current source 130a is constant, as the resistance value of the magnetic tunnel junction element increases, the reference voltage VR1 may decrease. Also, in the case that the amplitude of the current provided from the current source 130a is constant, as the resistance value of the magnetic tunnel junction element decreases, the reference voltage VR1 may increase. Therefore, the reference voltage VR1 may change based on the resistance value of the magnetic tunnel junction element.

For example, the reference element 110a may be a voltage source VA. In the case that the reference element 110a is the voltage source VA, as the voltage of the voltage source VA increases, the reference voltage VR1 may decrease. Also, as the voltage of the voltage source VA decreases, the reference voltage VR1 may increase. Therefore, the reference voltage VR1 may change based on the voltage of the voltage source VA.

Figure 11:
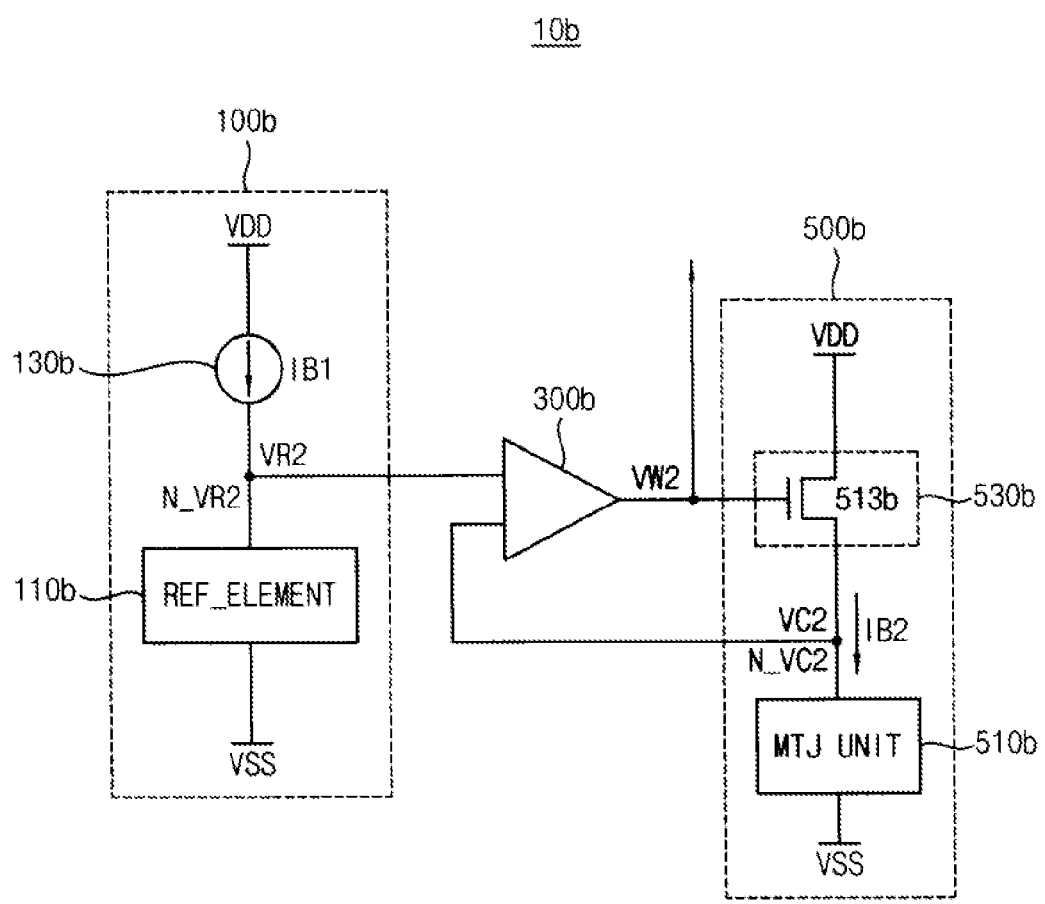
FIG. 11 is a block diagram illustrating a voltage generator according to example embodiments.

FIG. 11 is a block diagram illustrating a voltage generator according to example embodiments.

Referring to FIG. 11, a voltage generator 10b includes a reference voltage providing unit 100b, a comparison voltage providing unit 500b and a comparison unit 300b. The reference voltage providing unit 100b includes a current source 130b connected between a power supply voltage VDD and a reference voltage node N_VR2 and a reference element 110b connected between the reference voltage node N_VR2 and a ground voltage VSS.

The reference voltage providing unit 100b outputs a reference voltage VR2 through the reference voltage node N_VR2. For example, the reference element 110b may be a resistor element R. In the case that the amplitude of that current provided from the current source 130b is constant, as the resistance value of the resistor element R increases, the reference voltage VR2 may increase. Also, in the case that the amplitude of the current provided from the current source 130b is constant, as the resistance value of the resistor element R decreases, the reference voltage VR2 may decrease. For example, in the case that the resistance value of the resistor element R is constant, as the amplitude of the current provided from the current source 130*b* increases, the reference voltage VR2 may increase. Also, in the case that the resistance value of the resistor element R is constant, as the amplitude of the current provided from the current source 130*b* decreases, the reference voltage VR2 may decrease. For example, the resistance value of the resistor element R may be predetermined before the voltage generator 10*b* operates. The reference voltage node N_VR2 connects the reference element 110*b* to the current source 130*b*.

The comparison voltage providing unit 500*b* includes a transistor switch unit 530*b* connected between the power supply voltage VDD and a comparison voltage node N_VC2 and a magnetic tunnel junction unit 510*b* connected between the ground voltage VSS and the comparison voltage node N_VC2. The comparison voltage providing unit 500*b* outputs a comparison voltage VC2 through the comparison voltage node N_VC2. The comparison unit 300*b* provides a write voltage VW2 to the transistor switch unit 530*b* by comparing the reference voltage VR2 and the comparison voltage VC2.

For example, the reference voltage VR2 provided from the reference voltage providing unit 100*b* and the comparison voltage VC2 provided from the comparison voltage providing unit 500*b* may be inputs of the comparison unit 300*b*. The comparison unit 300*b* may provide the write voltage VW2 to the comparison voltage providing unit 500*b* by comparing the reference voltage VR2 and the comparison voltage VC2. In the case that the process, voltage and temperature are not changed, the reference voltage VR2 and the comparison voltage VC2 may be constant. In this case, the comparison voltage VC2 may be less than the reference voltage VR2. If the reference voltage VR2 and the comparison voltage VC2 that are the inputs of the comparison unit 300*b* are constant, the write voltage VW2 that is the output of the comparison unit 300*b* may be constant. If the write voltage VW2 is constant, the write voltage VW2 may be provided to the transistor switch 531*b* included in the transistor switch unit 530*b*. If the write voltage VW2 that is constant is provided to the transistor switch 531*b*, the amplitude of the current between the magnetic tunnel junction unit 510*b* and the transistor switch unit 530*b* may be constant.

As time passes, the process, the voltage and the temperature may change. For example, the temperature of the system including the voltage generator 10*b* may increase. If the temperature of the system including the voltage generator 10*b* increases, the resistance value of the magnetic tunnel junction element of the magnetic tunnel junction unit 510*b* included in the voltage generator 10*b* may decrease and the amplitude of the current between the magnetic tunnel junction unit 510*b* and the transistor switch unit 530*b* may decrease. If the resistance value of the magnetic tunnel junction element decreases and the amplitude of the current between the magnetic tunnel junction unit 510*b* and the transistor switch unit 530*b* decreases, the comparison voltage VC2 may decrease. If the comparison voltage VC2 decreases, the voltage difference between the reference voltage VR2 and the comparison voltage VC2 may increase. If the voltage difference between the reference voltage VR2 and the comparison voltage VC2 increases, the write voltage VW2 may increase. In the case that the write voltage VW2 increases, a gate voltage of the transistor switch 531*b* included in the transistor switch unit 530*b* may increase. If the gate voltage of the transistor switch increases, the amplitude of the current between the magnetic tunnel junction unit 510*b* and the transistor switch unit 530*b* may increase.

Therefore, if the temperature of the system including the voltage generator 10*b* increases, the amplitude of the current between the magnetic tunnel junction unit 510*b* and the transistor switch unit 530*b* may decrease. If the amplitude of the current between the magnetic tunnel junction unit 510*b* and the transistor switch unit 530*b* decreases, the amplitude of the current between the magnetic tunnel junction unit 510*b* and the transistor switch unit 530*b* may increase as the voltage generator 10*b* increases the write voltage VW2. In this case, the voltage generator 10*b* may maintain the constant amplitude of the current between the magnetic tunnel junction unit 510*b* and the transistor switch unit 530*b* regardless of the increase of the temperature.

As time passes, the process, the voltage and the temperature may change again. For example, the temperature of the system including the voltage generator 10*b* may decrease. If the temperature of the system including the voltage generator 10*b* decreases, the resistance value of the magnetic tunnel junction element of the magnetic tunnel junction unit 510*b* included in the voltage generator 10*b* may increase and the amplitude of the current between the magnetic tunnel junction unit 510*b* and the transistor switch unit 530*b* may increase. If the resistance value of the magnetic tunnel junction element increases and the amplitude of the current between the magnetic tunnel junction unit 510*b* and the transistor switch unit 530*b* increases, the comparison voltage VC2 may increase. If the comparison voltage VC2 increases, the voltage difference between the reference voltage VR2 and the comparison voltage VC2 may decrease. If the voltage difference between the reference voltage VR2 and the comparison voltage VC2 decreases, the write voltage VW2 may decrease. In the case that the write voltage VW2 decreases, the gate voltage of the transistor switch 531*b* included in the transistor switch unit 530*b* may decrease. If the gate voltage of the transistor switch 531*b* decreases, the amplitude of the current between the magnetic tunnel junction unit 510*b* and the transistor switch unit 530*b* may decrease.

Therefore, if the temperature of the system including the voltage generator 10*b* decreases, the amplitude of the current between the magnetic tunnel junction unit 510*b* and the transistor switch unit 530*b* may increase. If the amplitude of the current between the magnetic tunnel junction unit 510*b* and the transistor switch unit 530*b* increases, the amplitude of the current between the magnetic tunnel junction unit 510*b* and the transistor switch unit 530*b* may decrease as the voltage generator 10*b* decreases the write voltage VW2. In this case, the voltage generator 10*b* may maintain the constant amplitude of the current between the magnetic tunnel junction unit 510*b* and the transistor switch unit 530*b* regardless of the decrease of the temperature.

If the voltage generator 10*b* according to example embodiments is used, the amplitude of the current between the magnetic tunnel junction unit 510*b* and the transistor switch unit 530*b* may be a constant regardless of the process, the voltage and the temperature.

As will be described referring to FIG. 21, the voltage generator 10*b* may provide a voltage to the word line included in the memory device. In the case that the current that is greater than a predetermined amount of current is transferred to the magnetic tunnel junction element, the magnetic tunnel junction element may break down. The amplitude of the current at which the magnetic tunnel junction element breaks down may be a breakdown current. To prevent the breakdown of the memory cell, a constant amplitude of the current that is less than the breakdown current may be transferred to the magnetic tunnel junction element. The voltage generator 10*b* may be used to provide a constant amplitude of the current that is less than the breakdown current to the magnetic tunnel junction element.

For example, the magnetic tunnel junction element included in the voltage generator 10b may be identical to the magnetic tunnel junction element included in the memory cell. The transistor switch 531b of the transistor switch unit 530b included in the voltage generator 10b may be identical to the transistor switch included in the memory cell. In this case, the write voltage VW2 may be transferred to the gate of the transistor switch included in the memory cell. The comparison voltage VC2 providing unit 500b may be identical to the memory cell. Therefore, the amplitude of the current between the magnetic tunnel junction element included in the voltage generator 10b and the transistor switch 531b included in the voltage generator 10b may be identical to the amplitude of the current between the magnetic tunnel junction element included in the memory cell and the transistor switch included in the memory cell.

If the voltage generator 10b according to example embodiments is used, the amplitude of the current between the magnetic tunnel junction unit 510b included in the voltage generator 10b and the transistor switch unit 530b included in the voltage generator 10b may be a constant regardless of the process, the voltage and the temperature. If the amplitude of the current between the magnetic tunnel junction unit 510b included in the voltage generator 10b and the transistor switch unit 530b included in the voltage generator 10b maintains the constant, the amplitude of the current between the magnetic tunnel junction element included in the memory cell and the transistor switch included in the memory cell may be constant. Therefore, if the voltage generator 10b according to example embodiments is used, the constant amplitude of the current that is less than the breakdown current may be transferred to the magnetic tunnel junction element. If the constant amplitude of the current that is less than the breakdown current is transferred to the magnetic tunnel junction element, the breakdown of the memory cell may be prevented.

In an example embodiment, an amplitude of the current between the magnetic tunnel junction unit 510b and the transistor switch unit 530b may be determined based on an amplitude of the current of the current source 130b. For example, the reference element 110b may be a resistor element R. In the case that the resistance value of the resistor element R is constant, as the amplitude of the current provided from the current source 130b increases, the reference voltage VR2 may increase. Also, in the case that the resistance value of the resistor element R is constant, as the amplitude of the current provided from the current source 130b decreases, the reference voltage VR2 may decrease.

If the reference voltage VR2 changes, the voltage difference between the reference voltage VR2 and the comparison voltage VC2 may change. If the voltage difference between the reference voltage VR2 and the comparison voltage VC2 changes, the write voltage VW2 that is the output of the comparison unit 300b may change. If the write voltage VW2 changes, the gate voltage of the transistor switch 531b included in the transistor switch unit 530b may change. If the gate voltage of the transistor switch 531b changes, the amplitude of the current between the magnetic tunnel junction unit 510b and the transistor switch unit 530b may change.

For example, the comparison voltage VC2 may be less than the reference voltage VR2. If the amplitude of the current provided from the current source 130b increases, the reference voltage VR2 may increase. If the reference voltage VR2 increases, the voltage difference between the reference voltage VR2 and the comparison voltage VC2 may increase. If the voltage difference between the reference voltage VR2 and the comparison voltage VC2 increases, the write voltage VW2 that is the output of the comparison unit 300b may increase. In the case that the write voltage VW2 increases, the gate voltage of the transistor switch included in the transistor switch unit 530b may increase. If the gate voltage of the transistor switch increases, the amplitude of the current between the magnetic tunnel junction unit 510b and the transistor switch unit 530b may increase. Therefore, if the amplitude of the current of the current source 130b increases, the amplitude of the current between the magnetic tunnel junction unit 510b and the transistor switch unit 530b may increase.

As time passes, the amplitude of the current provided from the current source 130b may decrease. If the amplitude of the current provided from the current source 130b decreases, the reference voltage VR2 may decrease. If the reference voltage VR2 decreases, the voltage difference between the reference voltage VR2 and the comparison voltage VC2 may decrease. If the voltage difference between the reference voltage VR2 and the comparison voltage VC2 is decreases, the write voltage VW2 that is the output of the comparison unit 300b may decrease. In the case that the write voltage VW2 decreases, the gate voltage of the transistor switch 531b included in the transistor switch unit 530b may decrease. If the gate voltage of the transistor switch 531b decreases, the amplitude of the current between the magnetic tunnel junction unit 510b and the transistor switch unit 530b may decrease. Therefore, if the amplitude of the current of the current source 130b decreases, the amplitude of the current between the magnetic tunnel junction unit 510b and the transistor switch unit 530b may decrease.

Figure 12:
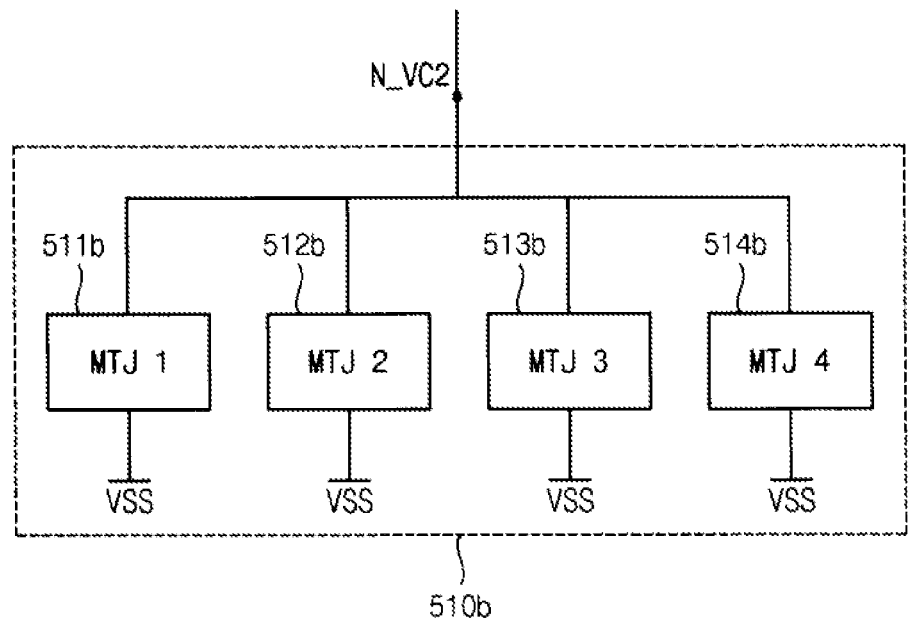
FIG. 12 is a block diagram illustrating an example of a magnetic tunnel junction unit included in the voltage generator of FIG. 11.
Figure 13:
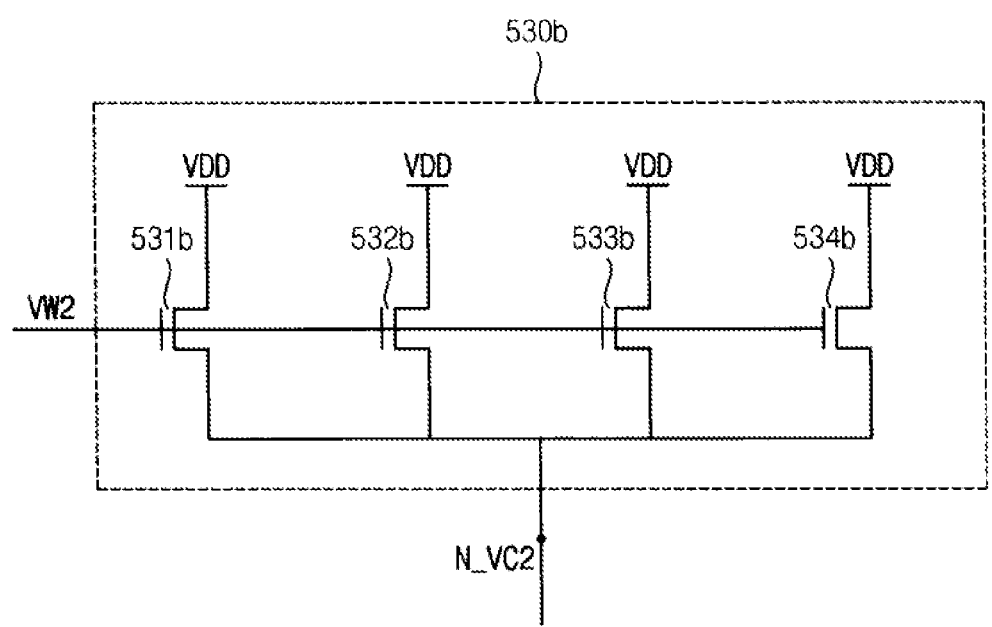
FIG. 13 is a block diagram illustrating an example of a transistor switch unit included in the voltage generator of FIG. 11.

FIG. 12 is a block diagram illustrating an example of a magnetic tunnel junction unit included in the voltage generator of FIG. 11 and FIG. 13 is a block diagram illustrating an example of a transistor switch unit included in the voltage generator of FIG. 11.

Referring to FIGS. 12 and 13, the magnetic tunnel junction unit 510b may include a plurality of magnetic tunnel junction elements 511b to 514b connected between the ground voltage VSS and the comparison voltage node N_VC2. The transistor switch unit 530b may include a plurality of transistor switches 531b to 534b connected between the power supply voltage VDD and the comparison voltage node N_VC2. The magnetic tunnel junction unit 510b may include a first to fourth magnetic tunnel junction elements 511b to 514b. The voltage generator 10b according to example embodiments may provide the voltage to the word line included in the memory device. To prevent the breakdown of the memory cell, a constant amplitude of the current that is less than the breakdown current may be transferred to the magnetic tunnel junction element. The voltage generator 10b may be used to provide a constant amplitude of the current that is less than the breakdown current to the magnetic tunnel junction element.

For example, the magnetic tunnel junction element included in the voltage generator 10b may be identical to the magnetic tunnel junction element included in the memory cell. The write voltage VW2 may be transferred to the gate of the transistor switch included in the memory cell. In this case, the comparison voltage providing unit 500b may be identical to the memory cell. Therefore, the amplitude of the current between the magnetic tunnel junction element included in the voltage generator 10b and the transistor switch included in the voltage generator 10b may be identical to the amplitude of the current between the magnetic tunnel junction element included in the memory cell and the transistor switch included in the memory cell.

The plurality of magnetic tunnel junction elements 511b to 514b may be used so that the magnetic tunnel junction unit 510b is identical to the magnetic tunnel junction element included in the memory cell. For example, the resistance value of the magnetic tunnel junction unit 510b included in the voltage generator 10b may be different from the resistance value of the magnetic tunnel junction element included in the memory cell. In the case that the resistance value of the magnetic tunnel junction unit 510b included in the voltage generator 10b is different from the resistance value of the magnetic tunnel junction element included in the memory cell, the amplitude of the current between the magnetic tunnel junction unit 510b included in the voltage generator 10b and the transistor switch unit 530b included in the voltage generator 10b may be different from the amplitude of the current between the magnetic tunnel junction element included in the memory cell and the transistor switch included in the memory cell. Therefore, the resistance value of the magnetic tunnel junction unit 510b included in the voltage generator 10b should be identical to the resistance value of the magnetic tunnel junction element included in the memory cell. The plurality of magnetic tunnel junction elements 511b to 514b may be used so that the resistance value of the magnetic tunnel junction unit 510b is identical to the resistance value of the magnetic tunnel junction element included in the memory cell. For example, in the case that the first magnetic tunnel junction element 511b, the second magnetic tunnel junction element 512b, the third magnetic tunnel junction element 513b and the fourth magnetic tunnel junction element 514b are connected in parallel, the resistance value of the magnetic tunnel junction unit 510b included in the voltage generator 10b may be identical to the resistance value of the magnetic tunnel junction element included in the memory cell.

The transistor switch unit 530b may include a first to fourth transistor switch 531b to 534b. For example, the transistor switch of the transistor switch unit 530b included in the voltage generator 10b may be identical to the transistor switch included in the memory cell. The write voltage VW2 may be transferred to the gate of the transistor switch included in the memory cell. In this case, the comparison voltage providing unit 500b may be identical to the memory cell. Therefore, the amplitude of the current between the magnetic tunnel junction unit 510b included in the voltage generator 10b and the transistor switch unit 530b included in the voltage generator 10b may be identical to the amplitude of the current between the magnetic tunnel junction element included in the memory cell and the transistor switch included in the memory cell.

The plurality of transistor switches 531b to 534b may be used so that the transistor switch unit 530b included in the voltage generator 10b is identical to the transistor switch included in the memory cell. For example, the resistance value of the transistor switch unit 530b included in the voltage generator 10b may be different from the resistance value of the transistor switch included in the memory cell. In the case that the resistance value of the transistor switch unit 530b included in the voltage generator 10b is different from the resistance value of the transistor switch included in the memory cell, the amplitude of the current between the magnetic tunnel junction unit 510b included in the voltage generator 10b and the transistor switch unit 530b included in the voltage generator 10b may be different from the amplitude of the current between the magnetic tunnel junction element included in the memory cell and the transistor switch included in the memory cell. Therefore, resistance value of the transistor switch unit 530b included in the voltage generator 10b should be identical to the resistance value of the transistor switch included in the memory cell. The plurality of transistor switches 531b to 534b may be used so that the resistance value of the transistor switch unit 530b is identical to the resistance value of the transistor switch included in the memory cell. For example, in the case that the first transistor switch 531b, the second transistor switch 532b, the third transistor switch 533b and the fourth transistor switch 534b are connected in parallel, the resistance value of the transistor switch unit 530b included in the voltage generator 10b may be identical to the resistance value of the transistor switch included in the memory cell.

Figure 14:
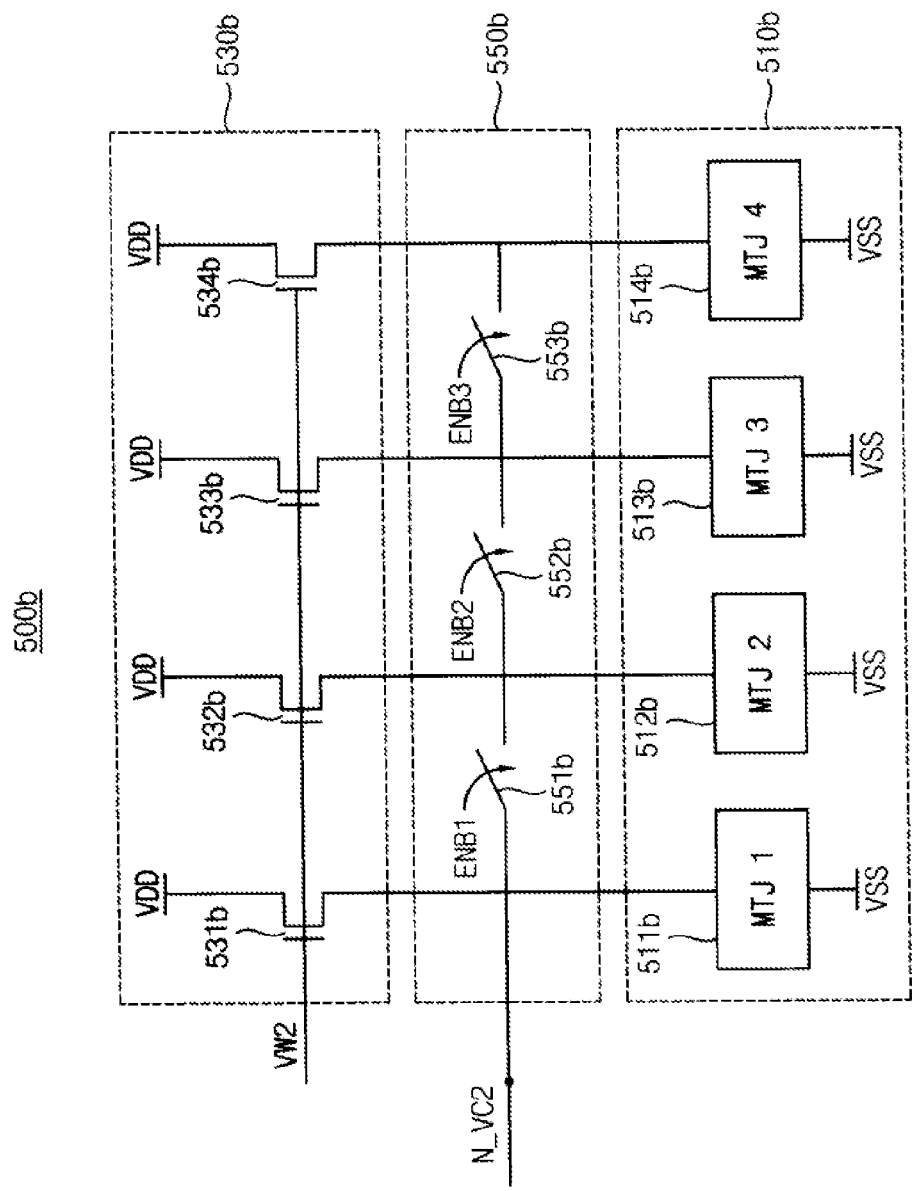
FIG. 14 is a block diagram illustrating an example of a comparison voltage providing unit included in the voltage generator of FIG. 11.

FIG. 14 is a block diagram illustrating an example of a comparison voltage providing unit included in the voltage generator of FIG. 11.

Referring to FIG. 14, the voltage generator 10b may further comprise control switches 551b to 553b that selectively connect the magnetic tunnel junction elements and the transistor switches to the comparison voltage node N_VC2. The magnetic tunnel junction unit 510b may include the first magnetic tunnel junction element 511b, the second magnetic tunnel junction element 512b, the third magnetic tunnel junction element 513b and the fourth magnetic tunnel junction element 514b. The transistor switch unit 530b may include the first transistor switch 531b, the second transistor switch 532b, the third transistor switch 533b and the fourth transistor switch 534b. The control switches 551b to 553b may include a first control switch 551b, a second control switch 552b and a third control switch 553b. The resistance value of the magnetic tunnel junction unit 510b and the resistance value of the transistor switch unit 530b may be controlled by selecting the control switches.

For example, in the case that the first control switch 551b is turned-off, the first magnetic tunnel junction element 511b and the first transistor switch 531b may be connected to the comparison voltage node N_VC2 and the second magnetic tunnel junction element 512b, the third magnetic tunnel junction element 513b, the fourth magnetic tunnel junction element 514b, the second transistor switch 532b, the third transistor switch 533b and the fourth transistor switch 534b may not be connected to the comparison voltage node N_VC2. Also, in the case that the first control switch 551b is turned-on, the first magnetic tunnel junction element 511b the second magnetic tunnel junction element 512b, the first transistor switch 531b and the second transistor switch 532b may be connected to the comparison voltage node N_VC2 and the third magnetic tunnel junction element 513b, the fourth magnetic tunnel junction element 514b, the third transistor switch 533b and the fourth transistor switch 534b may not be connected to the comparison voltage node N_VC2. Also, in the case that the first control switch 551b and the second control switch 552b are turned-on, the first magnetic tunnel junction element 511b, the second magnetic tunnel junction element 512b, the third magnetic tunnel junction element 513b, the first transistor switch 531b and the second transistor switch 532b and the third transistor switch 533b may be connected to the comparison voltage node N_VC2 and the fourth magnetic tunnel junction element 514b and the fourth transistor switch 534b may not be connected to the comparison voltage node N_VC2. Also, in the case that the first control switch 551b, the second control switch 552b and the third control switch 553b are turned-on, the first magnetic tunnel junction element, the second magnetic tunnel junction element 512b, the third magnetic tunnel junction element 513b, the fourth magnetic tunnel junction element 514b, the first transistor switch 531b, the second transistor switch 532b, the third transistor switch 533b and the fourth transistor switch 534b may be connected to the comparison voltage node N_VC2.

Figure 15:
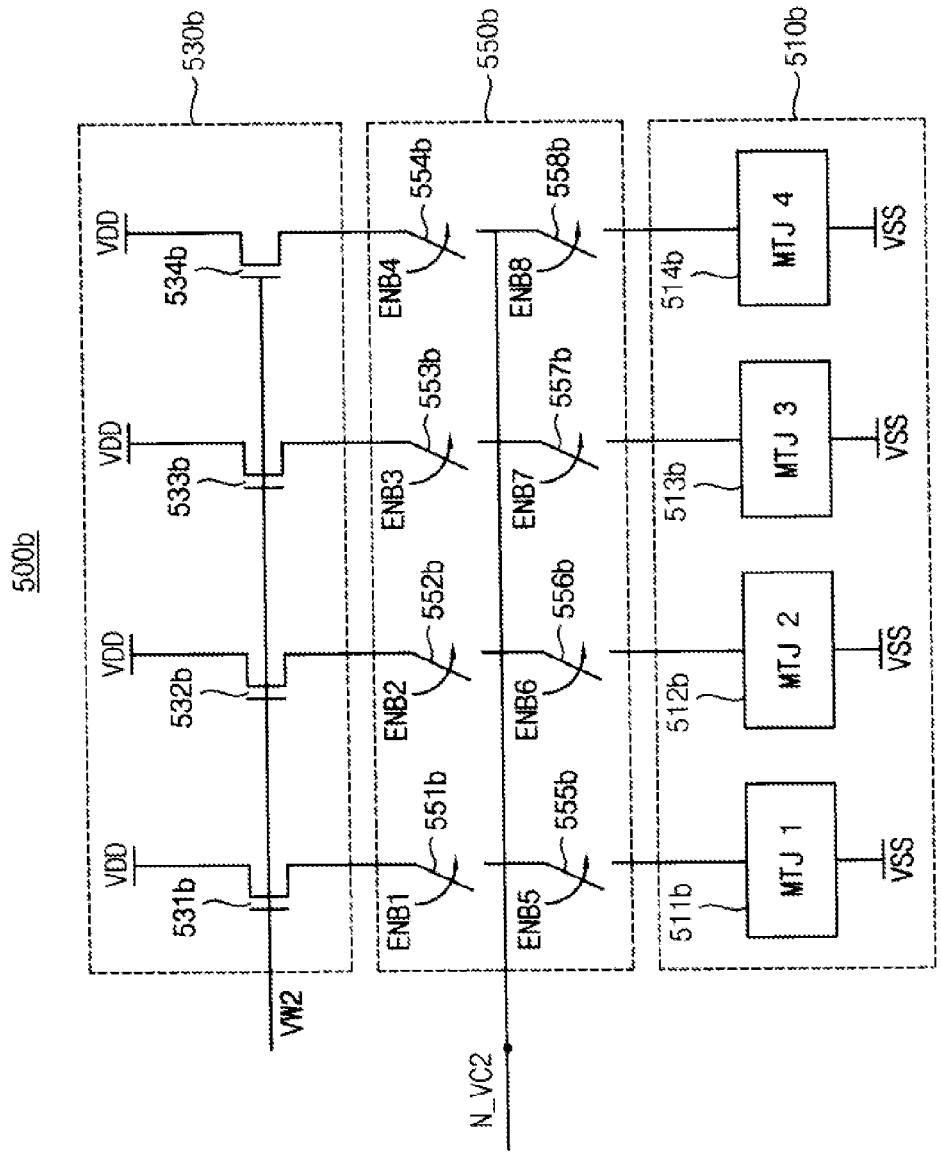
FIG. 15 is a block diagram illustrating another example of a comparison voltage providing unit included in the voltage generator of FIG. 11.

FIG. 15 is a block diagram illustrating another example of a comparison voltage providing unit included in the voltage generator of FIG. 11.

Referring to FIG. 15, the voltage generator 10b may include the control switches that selectively connect the magnetic tunnel junction elements and the transistor switches to the comparison voltage node N_VC2. The magnetic tunnel junction unit 510b may include the first magnetic tunnel junction element 511b, the second magnetic tunnel junction element 512b, the third magnetic tunnel junction element 513b and the fourth magnetic tunnel junction element 514b. The transistor switch unit 530b may include the first transistor switch 531b, the second transistor switch 532b, the third transistor switch 533b and the fourth transistor switch 534b. The control switches may include a first to eighth control switches. The resistance value of the magnetic tunnel junction unit 510b and the resistance value of the transistor switch unit 530b may be controlled by selecting the control switches.

For example, in the case that the first control switch 551b and the fifth control switch 555b are turned-on, the first magnetic tunnel junction element 511b and the first transistor switch 531b may be connected to the comparison voltage node N_VC2. Also, in the case that the first control switch 551b, the second control switch 552b and the fifth control switch 555b are turned-on, the first magnetic tunnel junction element 511b, the second magnetic tunnel junction element 512b and the first transistor switch 531b may be connected to the comparison voltage node N_VC2. Also, in the case that the first control switch 551b, the fourth control switch 554b and the fifth control switch 555b are turned-on, the first magnetic tunnel junction element 511b, the fourth magnetic tunnel junction element 514b and the first transistor switch 531b may be connected to the comparison voltage node N_VC2. Also, in the case that the first control switch 551b, the fifth control switch 555b and the sixth control switch 556b are turned-on, the first magnetic tunnel junction element 511b, the first transistor switch 531b and the second transistor switch 532b may be connected to the comparison voltage node N_VC2. Also, in the case that the first control switch 551b, the fifth control switch 555b and the seventh control switch 557b are turned-on, the first magnetic tunnel junction element 511b, the first transistor switch 531b and the third transistor switch 533b may be connected to the comparison voltage node N_VC2.

The first to fourth control switches 551b to 554b may be used to control the first to fourth magnetic tunnel junction elements 511b to 514b. The first to fourth control switches 551b to 554b may be controlled based on the first to fourth enable signals ENB1 to ENB4. If the first to fourth control switches 551b to 554b are controlled, the resistance value of the magnetic tunnel junction unit 510b may be controlled. The fifth to eighth control switches 555b to 558b may be used to control the first to fourth transistor switches 531b to 534b. The fifth to eighth control switches 555b to 558b may be controlled based on the fifth to eighth enable signals ENB5 to ENB8. If the fifth to eighth control switches 555b to 558b are controlled, the resistance value of the transistor switch unit 530b may be controlled.

Figure 16:
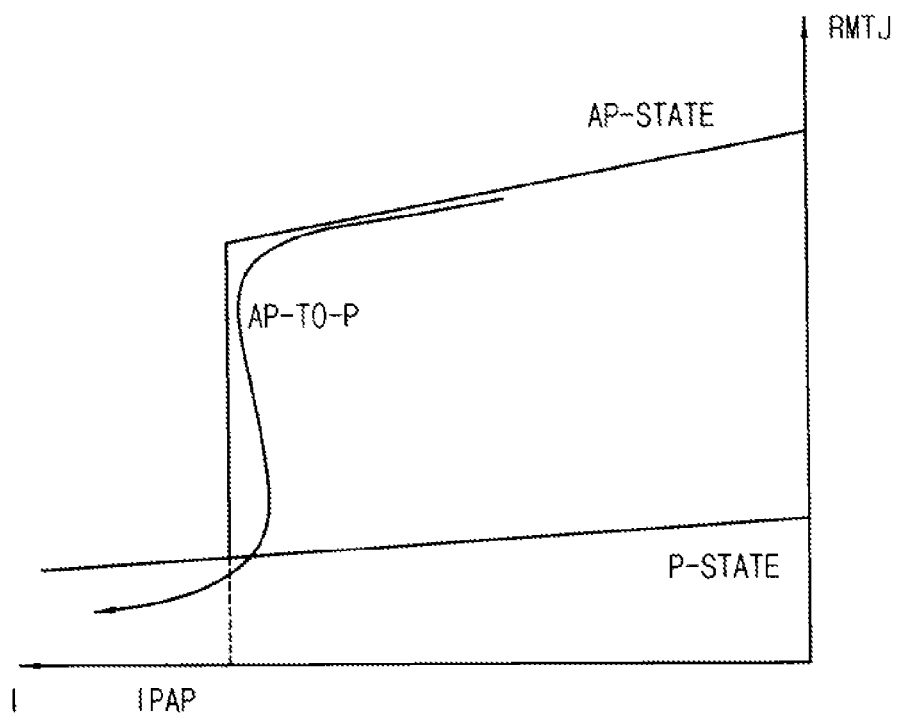
FIGS. 16 and 17 are diagrams for describing examples of write operation of a memory device including the voltage generator of FIG. 11.
Figure 17:
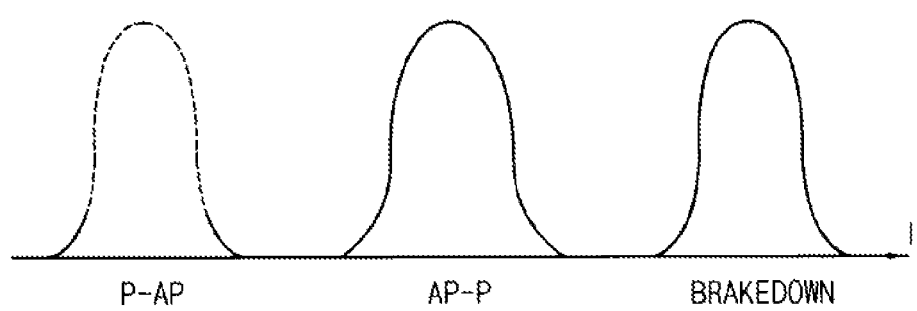
Figure 18:
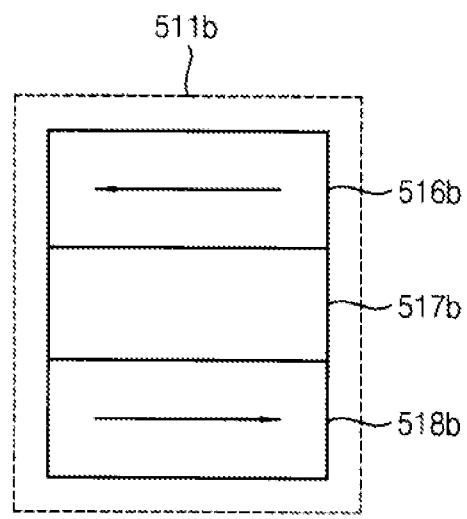
FIG. 18 is a diagram illustrating an example of a magnetic tunnel junction element included in the magnetic tunnel junction unit of FIG. 12.

FIGS. 16 and 17 are diagrams for describing examples of write operation of a memory device including the voltage generator of FIG. 11 and FIG. 18 is a diagram illustrating an example of a magnetic tunnel junction element included in the magnetic tunnel junction unit of FIG. 12.

Referring to FIGS. 16 to 18, the amplitude of the current between the magnetic tunnel junction unit 510b and the transistor switch unit 530b may be less than the amplitude of break down current of the magnetic junction elements. The magnetic tunnel junction element 511b may include a first layer 516b, a second layer 517b and a third layer 518b. Spin directions of the first layer 516b and the third layer 518b included in the magnetic tunnel junction element may be different based on the direction of current transferred to the magnetic tunnel junction element. A state in which the spin directions of the first layer 516b and the third layer 518b are same may be a first state P-STATE. A state in which the spin directions of the first layer 516b and the third layer 518b are different may be a second state AP-STATE.

For example, to write the magnetic tunnel junction element from the first state P-STATE to the second state AP-STATE, the write current that is greater than a predetermined amount of current may be needed. Also, to prevent the breakdown of the magnetic tunnel junction element, the amplitude of the write current may be less than the amplitude of the breakdown current. If the voltage generator 10b according to example embodiments is used, the amplitude of the current between the magnetic tunnel junction unit 510b included in the voltage generator 10b and the transistor switch unit 530b included in the voltage generator 10b may be a constant.

In an example embodiment, a magnetic tunnel junction element included in the magnetic tunnel junction unit 510b may be precharged as the second state AP-STATE in which the spin directions of the first layer 516b and the third layer 518b included in the magnetic tunnel junction element are different.

Figure 19:
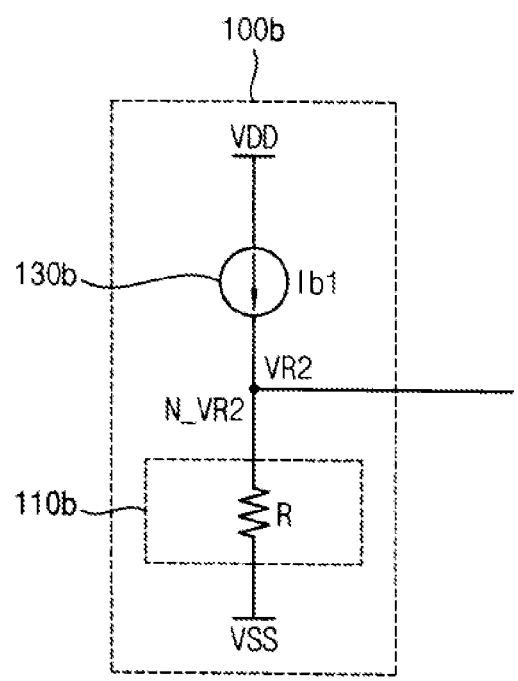
FIGS. 19 and 20 are block diagrams illustrating examples of a reference voltage providing unit included in the voltage generator of FIG. 11.
Figure 20:
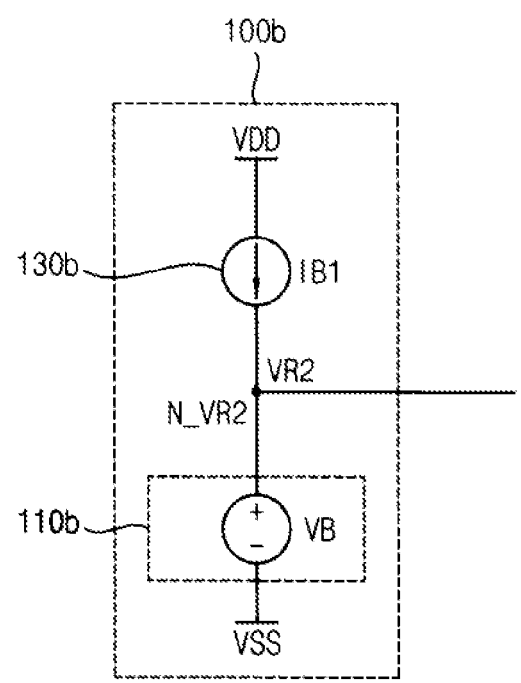

FIGS. 19 and 20 are block diagrams illustrating examples of a reference voltage providing unit included in the voltage generator of FIG. 11.

Referring to FIGS. 19 and 20, the reference voltage providing unit 100b may output a reference voltage VR2 through the reference voltage node N_VR2. The reference element 110b may be one of a resistor element R, a magnetic tunnel junction element and a voltage source VB.

For example, the reference element 110b may be the resistor element R. In the case that the amplitude of the current provided from the current source 130b is constant, as resistance value of the resistor element R increases, the reference voltage VR2 may increase. Also, in the case that the amplitude of the current provided from the current source 130b is constant, as resistance value of the resistor element R decreases, the reference voltage VR2 may decrease. Therefore, the reference voltage VR2 may change based on the resistance value of the resistor element R.

For example, the reference element 110b may be the magnetic tunnel junction element. In the case that the amplitude of the current provided from the current source 130b is constant, as resistance value of the magnetic tunnel junction element increases, the reference voltage VR2 may increase. Also, in the case that the amplitude of the current provided from the current source 130b is constant, as resistance value of the magnetic tunnel junction element decreases, the reference voltage VR2 may decrease. Therefore, the reference voltage VR2 may change based on the resistance value of the magnetic tunnel junction element.

For example, the reference element 110b may be a voltage source VB. In the case that the reference element 110b is the voltage source VB, as the voltage of the voltage source VB increases, the reference voltage VR2 may increase. Also, as the voltage of the voltage source VB decreases, the reference voltage VR2 may decrease. Therefore, the reference voltage VR2 may change based on the voltage of the voltage source VB.

Figure 21:
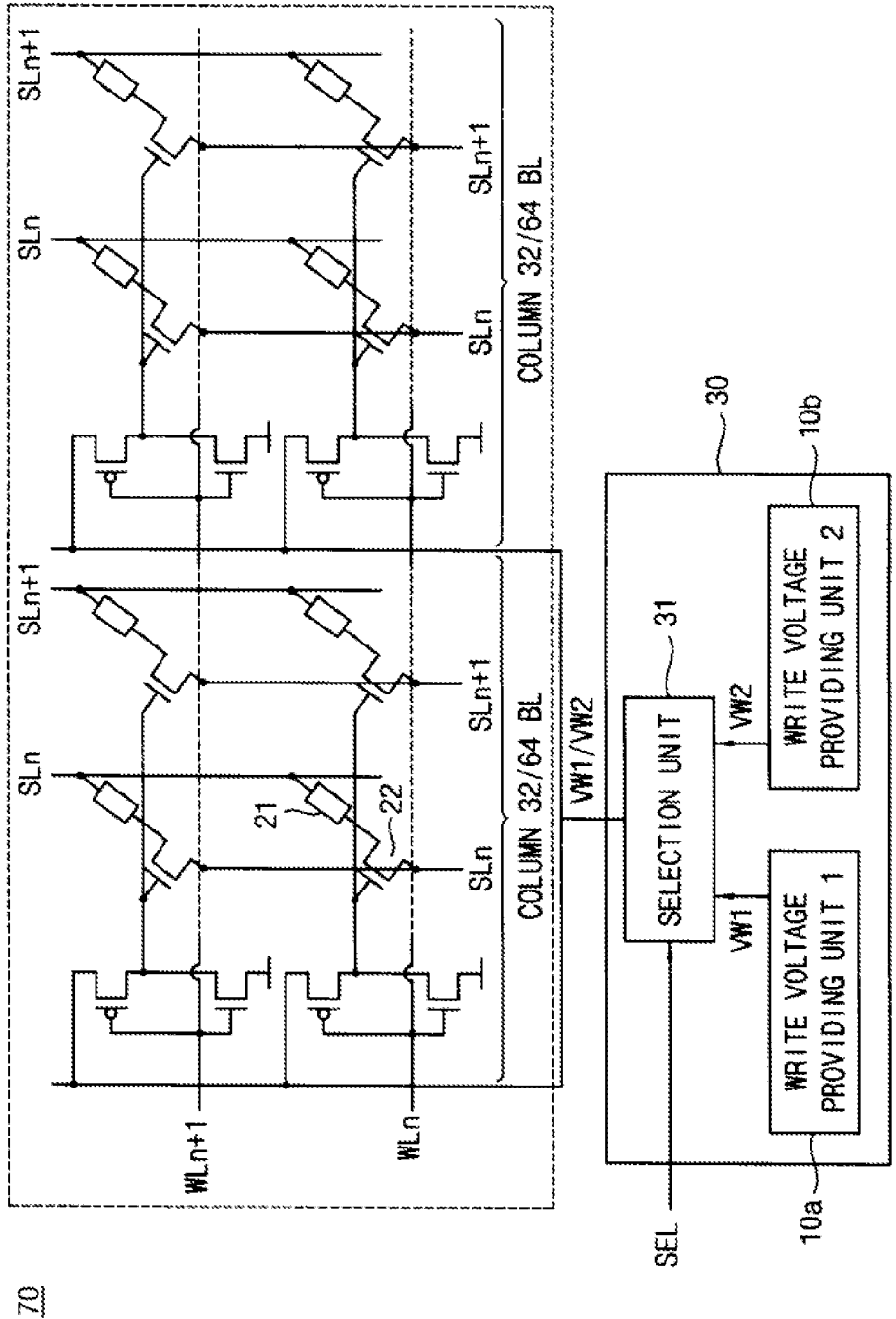
FIG. 21 is a block diagram illustrating a memory device according to example embodiments.
Figure 22:
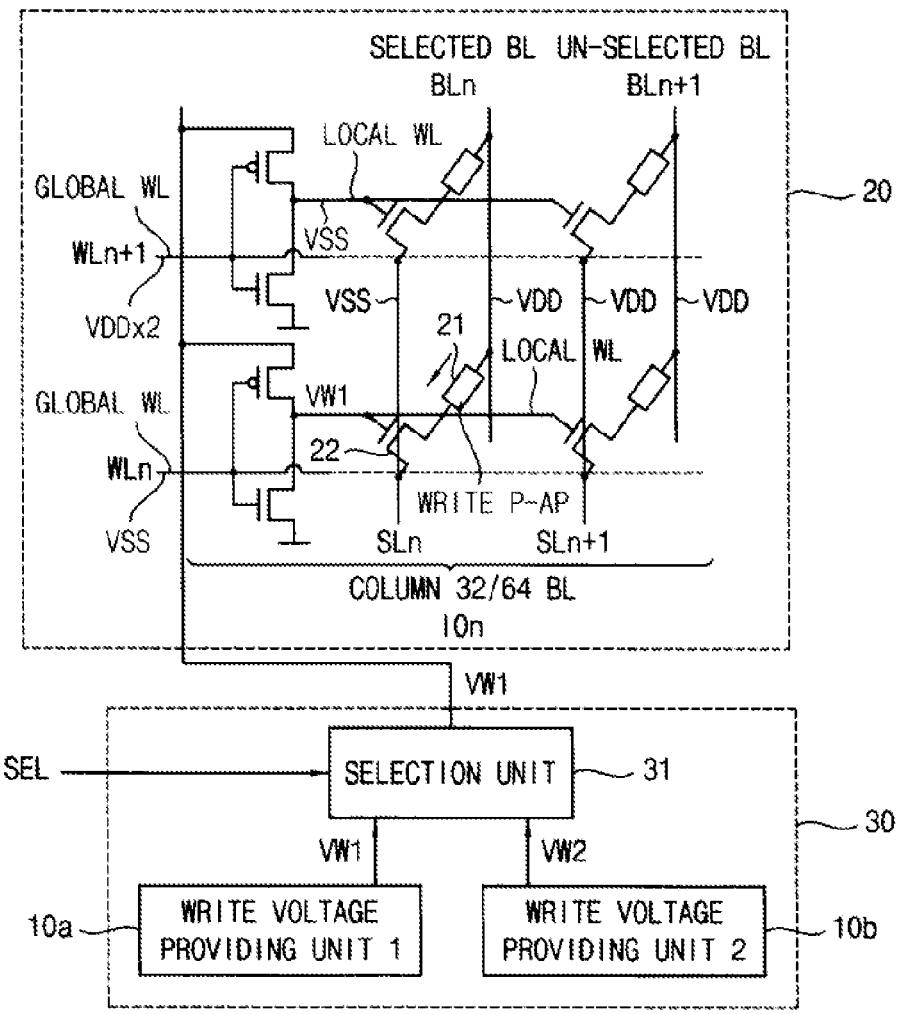
FIG. 22 is a diagram illustrating an example of a write operation of the memory device of FIG. 21.
Figure 23:
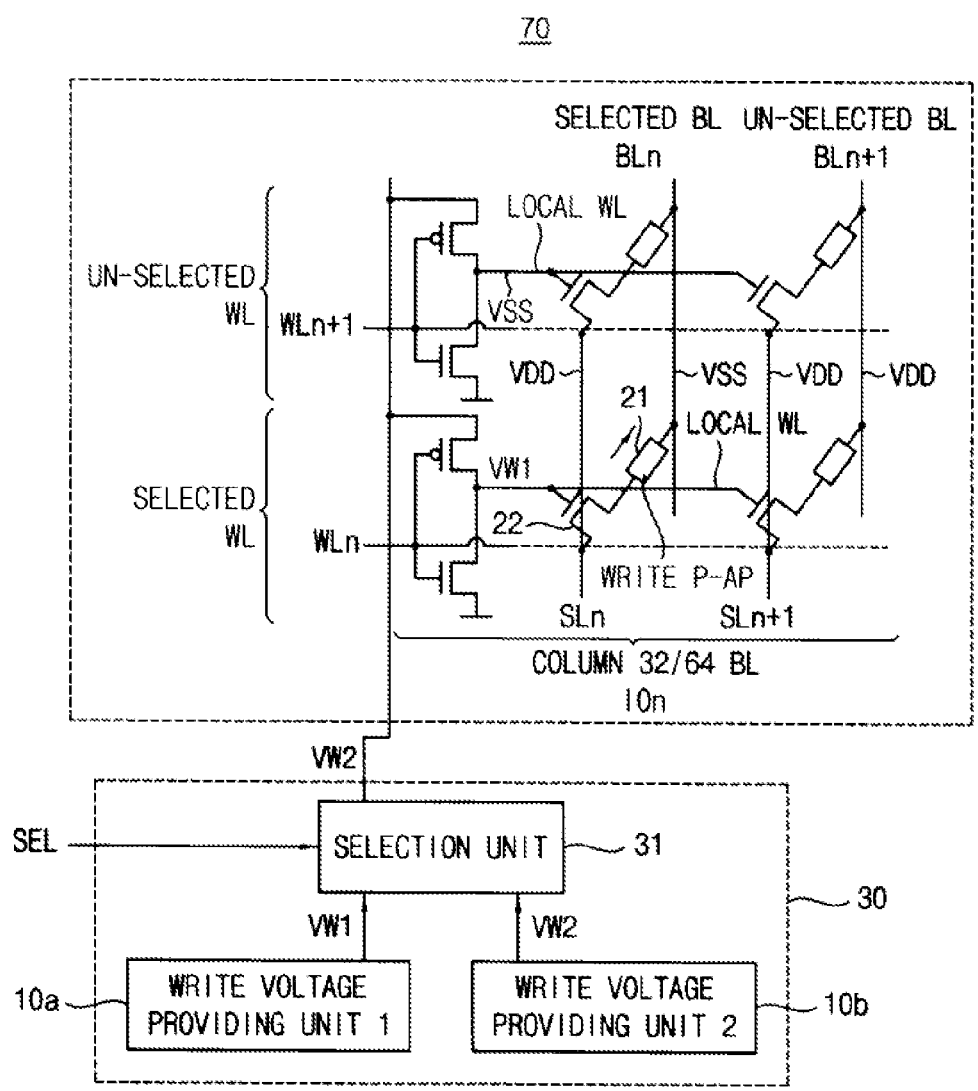
FIG. 23 is a diagram illustrating another example of a write operation of the memory device of FIG. 21.

FIG. 21 is a block diagram illustrating a memory device according to example embodiments. FIG. 22 is a diagram illustrating an example of a write operation of the memory device of FIG. 21 and FIG. 23 is a diagram illustrating another example of a write operation of the memory device of FIG. 21.

Referring to FIGS. 1, 11 and 21 to 23, a memory device 70 includes a memory cell array 20 and a write voltage providing unit 30. The write voltage providing unit 30 includes a first write voltage providing unit 10a and a second write voltage providing unit 10b. The memory cell array 20 includes memory cells being connected between a plurality of bit lines BL and a plurality of source lines SL. Each of the memory cells includes a switch transistor where a local word line LWL is connected to gate. The write voltage providing unit provides a first write voltage VW1 or a second write voltage VW2 to a corresponding local word line LWL when a global word line GWL is enabled. The first write voltage VW1 is outputted from a first write voltage providing unit 10a. The second write voltage VW2 is outputted from a second write voltage providing unit 10b. A selection unit 31 may select the first write voltage VW1 or the second write voltage VW2 based on a selection signal SEL.

The first write voltage providing unit 10a includes a first reference voltage providing unit 100a, a first comparison voltage providing unit 500a and a first comparison unit 300a. The first reference voltage providing unit 100a may include a first reference element 110a and a first current source 130a series-connected between a power supply voltage VDD and a ground voltage VSS. The first reference voltage providing unit 100a outputs a first reference voltage through a first reference voltage node N_VR1. The first reference voltage node NVR1 connects the first reference element 110a to the first current source 130a. The first comparison voltage providing unit 500a includes a first magnetic tunnel junction unit 510a connected between the power supply voltage VDD and a first comparison voltage node N_VC1 and a first transistor switch 531b unit connected between the ground voltage VSS and the first comparison voltage node N_VC1. The first comparison voltage providing unit 500a outputs a first comparison voltage VC1 through the first comparison voltage node N_VC1. The first comparison unit 300a provides a first write voltage VW1 to the first transistor switch 531b unit by comparing the first reference voltage VR1 and the first comparison voltage VC1.

For example, the first reference voltage VR1 provided from the first reference voltage providing unit 100a and the first comparison voltage VC1 provided from the first comparison voltage providing unit 500a may be inputs of the first comparison unit 300a. The first comparison unit 300a may provide the first write voltage VW1 to the first comparison voltage providing unit 500a by comparing the first reference voltage VR1 and the first comparison voltage VC1. In the case that the process, voltage and temperature are not changed, the first reference voltage VR1 and the first comparison voltage VC1 may be constant. In this case, the first comparison voltage VC1 may be greater than the first reference voltage VR1. If the first reference voltage VR1 and the first comparison voltage VC1 that are the inputs of the first comparison unit 300a are constant, the first write voltage VW1 that is the output of the first comparison unit 300a may be constant. If the first write voltage VW1 is constant, the first write voltage VW1 that is constant may be provided to the transistor switch included in the first transistor switch unit 530a. If the first write voltage VW1 that is constant is provided to the transistor switch, the amplitude of the current between the first magnetic tunnel junction unit 510a and the first transistor switch unit 530a may be constant.

As time passes, the process, the voltage and the temperature may change. For example, the temperature of the system including a first write voltage providing unit 10a may increase. If the temperature of the system including the first write voltage providing unit 10a increases, the resistance value of the magnetic tunnel junction element of the first magnetic tunnel junction unit 510a included in the first write voltage providing unit 10a may decrease and the amplitude of the current between the first magnetic tunnel junction unit 510a and the first transistor switch unit 530a may decrease. If the amplitude of the current between the first magnetic tunnel junction unit 510a and the first transistor switch unit 530a decreases, the first comparison voltage VC1 may increase. If the first comparison voltage VC1 increases, the voltage difference between the first reference voltage VR1 and the first comparison voltage VC1 may increase. If the voltage difference between the first reference voltage VR1 and the first comparison voltage VC1 increases, the first write voltage VW1 may increase. In the case that the first write voltage VW1 increases, a gate voltage of the transistor switch included in the first transistor switch unit 530a may increase. If the gate voltage of the transistor switch increases, the amplitude of the current between the first magnetic tunnel junction unit 510a and the first transistor switch unit 530a may increase.

Therefore, if the temperature of the system including the first write voltage providing unit 10a increases, the amplitude of the current between the first magnetic tunnel junction unit 510a and the first transistor switch unit 530a may decrease. If the amplitude of the current between the first magnetic tunnel junction unit 510a and the first transistor switch unit 530a decreases, the amplitude of the current between the first magnetic tunnel junction unit 510a and the first transistor switch unit 530a may increase as the first write voltage providing unit 10a increases the first write voltage VW1. In this case, the first write voltage providing unit 10a may maintain the constant amplitude of the current between the first magnetic tunnel junction unit 510a and the first transistor switch unit 530a regardless of the increase of the temperature.

As time passes, the process, the voltage and the temperature may change again. For example, the temperature of the system including the first write voltage providing unit 10a may decrease. If the temperature of the system including the first write voltage providing unit 10a decreases, the resistance value of the magnetic tunnel junction element of the first magnetic tunnel junction unit 510a included in the first write voltage providing unit 10a may increase and the amplitude of the current between the first magnetic tunnel junction unit 510a and the first transistor switch unit 530a may increase. If the resistance value of the magnetic tunnel junction element increases and the amplitude of the current between the first magnetic tunnel junction unit 510a and the first transistor switch unit 530a increases, the first comparison voltage VC1 may decrease. If the first comparison voltage VC1 decreases, the voltage difference between the first reference voltage VR1 and the first comparison voltage VC1 may decrease. If the voltage difference between the first reference voltage VR1 and the first comparison voltage VC1 decreases, the first write voltage VW1 may decrease. In the case that the first write voltage VW1 decreases, the gate voltage of the transistor switch included in the first transistor switch unit 530a may decrease. If the gate voltage of the transistor switch decreases, the amplitude of the current between the first magnetic tunnel junction unit 510a and the first transistor switch unit 530a may decrease.

Therefore, if the temperature of the system including the first write voltage providing unit 10a decreases, the amplitude of the current between the first magnetic tunnel junction unit 510a and the first transistor switch unit 530a may increase. If the amplitude of the current between the first magnetic tunnel junction unit 510a and the first transistor switch unit 530a increases, the amplitude of the current between the first magnetic tunnel junction unit 510a and the first transistor switch unit 530a may decrease as the first write voltage providing unit 10a decreases the first write voltage VW1. In this case, the first write voltage providing unit 10a may maintain the constant amplitude of the current between the first magnetic tunnel junction unit 510a and the first transistor switch unit 530a regardless of the decrease of the temperature.

If the first write voltage providing unit 10a according to example embodiments is used, the amplitude of the current between the first magnetic tunnel junction unit 510a and the first transistor switch unit 530a may be constant regardless of the process, the voltage and the temperature.

The first write voltage providing unit 10a may provide a voltage to the word line included in the memory device 70. In the case that the current that is greater than a predetermined amount of current is transferred to the magnetic tunnel junction element, the magnetic tunnel junction element may break down. The amplitude limit of the current that the magnetic tunnel junction element breaks down may be a breakdown current. To prevent the breakdown of the memory cell, a constant amplitude of the current that is less than the breakdown current may be transferred to the magnetic tunnel junction element. The first write voltage providing unit 10a may be used to provide a constant amplitude of the current that is less than the breakdown current to the magnetic tunnel junction element.

For example, the magnetic tunnel junction element included in the first write voltage providing unit 10a may be identical to the magnetic tunnel junction element 21 included in the memory cell. The transistor switch of the first transistor switch unit 530a included in the voltage generator 10b may be identical to the transistor switch 22 included in the memory cell. In this case, the first write voltage VW1 may be transferred to the gate of the transistor switch 22 included in the memory cell. The first comparison voltage providing unit 500a may be identical to the memory cell. Therefore, the amplitude of the current between the magnetic tunnel junction element included in the first write voltage providing unit 10a and the transistor switch included in the first write voltage providing unit 10a may be identical to the amplitude of the current between the magnetic tunnel junction element 21 included in the memory cell and the transistor switch 22 included in the memory cell.

If the first write voltage providing unit 10a according to example embodiments is used, the amplitude of the current between the first magnetic tunnel junction unit 510a included in the first write voltage providing unit 10a and the first transistor switch unit 530a included in the first write voltage providing unit 10a may be constant regardless of the process, the voltage and the temperature. If the amplitude of the current between the first magnetic tunnel junction unit 510a included in the first write voltage providing unit 10a and the first transistor switch unit 530a included in the first write voltage providing unit 10a is constant, the amplitude of the current between the magnetic tunnel junction element 21 included in the memory cell and the transistor switch 22 included in the memory cell may be constant. Therefore, if the first write voltage providing unit 10a according to example embodiments is used, the constant amplitude of the current that is less than the breakdown current may be transferred to the magnetic tunnel junction element. If the constant amplitude of the current that is less than the breakdown current is transferred to the magnetic tunnel junction element, the breakdown of the memory cell may be prevented.

The second write voltage providing unit 10b includes a second reference voltage providing unit 100b, a second comparison voltage providing unit 500b and a second comparison unit. The second reference voltage providing unit 100b includes a second current source 130b connected between a power supply voltage VDD and a second reference voltage node N_VR2 and a second reference element 110b connected between the second reference voltage node N_VR2 and a ground voltage VSS. The second reference voltage providing unit 100b outputs a second reference voltage VR2 through the second reference voltage node N_VR2. The second comparison voltage providing unit 500b includes a second transistor switch unit 530b connected between the power supply voltage VDD and a second comparison voltage node N_VC2 and a second magnetic tunnel junction unit 510b connected between the ground voltage VSS and the second comparison voltage node N_VC2. The second comparison voltage providing unit 500b outputs a second comparison voltage VC2 through the second comparison voltage node N_VC2. The second comparison unit provides a second write voltage VW2 to the second transistor switch unit 530b by comparing the second reference voltage VR2 and the second comparison voltage VC2.

For example, the second reference voltage VR2 provided from the second reference voltage providing unit 100b and the second comparison voltage VC2 provided from the second comparison voltage providing unit 500b may be inputs of the second comparison unit. The second comparison unit may provide the second write voltage VW2 to the second comparison voltage providing unit 500b by comparing the second reference voltage VR2 and the second comparison voltage VC2. In the case that the process, voltage and temperature are not changed, the second reference voltage VR2 and the second comparison voltage VC2 may be constant. In this case, the second comparison voltage VC2 may be less than the second reference voltage VR2. If the second reference voltage VR2 and the second comparison voltage VC2 that are the inputs of the second comparison unit are constant, the second write voltage VW2 that is the output of the second comparison unit may be constant. If the second write voltage VW2 is constant, the second write voltage VW2 that is constant may be provided to the transistor switch included in the second transistor switch unit 530b. If the second write voltage VW2 that is constant is provided to the transistor switch, the amplitude of the current between the second magnetic tunnel junction unit 510b and the second transistor switch unit 530b may be constant.

As time passes, the process, the voltage and the temperature may change. For example, the temperature of the system including the second write voltage providing unit 10b may increase. If the temperature of the system including the second write voltage providing unit 10b increases, the resistance value of the magnetic tunnel junction element of the second magnetic tunnel junction unit 510b included in the second write voltage providing unit 10b may decrease and the amplitude of the current between the second magnetic tunnel junction unit 510b and the second transistor switch unit 530b may decrease. If the resistance value of the magnetic tunnel junction element decreases and the amplitude of the current between the second magnetic tunnel junction unit 510b and the second transistor switch unit 530b decreases, the second comparison voltage VC2 may decrease. If the second comparison voltage VC2 is decreases, the voltage difference between the second reference voltage VR2 and the second comparison voltage VC2 may increase. If the voltage difference between the second reference voltage VR2 and the second comparison voltage VC2 increase, the second write voltage VW2 may increase. In the case that the second write voltage VW2 increases, a gate voltage of the transistor switch included in the second transistor switch unit 530b may increase. If the gate voltage of the transistor switch increases, the amplitude of the current between the second magnetic tunnel junction unit 510*b* and the second transistor switch unit 530*b* may increase.

Therefore, if the temperature of the system including the second write voltage providing unit 10*b* increases, the amplitude of the current between the second magnetic tunnel junction unit 510*b* and the second transistor switch unit 530*b* may decrease. If the amplitude of the current between the second magnetic tunnel junction unit 510*b* and the second transistor switch unit 530*b* decreases, the amplitude of the current between the second magnetic tunnel junction unit 510*b* and the second transistor switch unit 530*b* may increase as the second write voltage providing unit 10*b* increases the second write voltage VW2. In this case, the second write voltage providing unit 10*b* may maintain the constant amplitude of the current between the second magnetic tunnel junction unit 510*b* and the second transistor switch unit 530*b* regardless of the increase of the temperature.

As time passes, the process, the voltage and the temperature may change again. For example, the temperature of the system including the second write voltage providing unit 10*b* may decrease. If the temperature of the system including the second write voltage providing unit 10*b* decreases, the resistance value of the magnetic tunnel junction element of the second magnetic tunnel junction unit 510*b* included in the second write voltage providing unit 10*b* may increase and the amplitude of the current between the second magnetic tunnel junction unit 510*b* and the second transistor switch unit 530*b* may increase. If the resistance value of the magnetic tunnel junction element increases and the amplitude of the current between the second magnetic tunnel junction unit 510*b* and the second transistor switch unit 530*b* increases, the second comparison voltage VC2 may increase. If the second comparison voltage VC2 increases, the voltage difference between the second reference voltage VR2 and the second comparison voltage VC2 may decrease. If the voltage difference between the second reference voltage VR2 and the second comparison voltage VC2 decreases, the second write voltage VW2 may decrease. In the case that the second write voltage VW2 decreases, the gate voltage of the transistor switch included in the second transistor switch unit 530*b* may decrease. If the gate voltage of the transistor switch is decreases, the amplitude of the current between the second magnetic tunnel junction unit 510*b* and the second transistor switch unit 530*b* may decrease.

Therefore, if the temperature of the system including the second write voltage providing unit 10*b* decreases, the amplitude of the current between the second magnetic tunnel junction unit 510*b* and the second transistor switch unit 530*b* may increase. If the amplitude of the current between the second magnetic tunnel junction unit 510*b* and the second transistor switch unit 530*b* increases, the amplitude of the current between the second magnetic tunnel junction unit 510*b* and the second transistor switch unit 530*b* may decrease as the second write voltage providing unit 10*b* decreases the second write voltage VW2. In this case, the second write voltage providing unit 10*b* may maintain the constant amplitude of the current between the second magnetic tunnel junction unit 510*b* and the second transistor switch unit 530*b* regardless of the decrease of the temperature.

If the second write voltage providing unit 10*b* according to example embodiments is used, the amplitude of the current between the second magnetic tunnel junction unit 510*b* and the second transistor switch unit 530*b* may be constant regardless of the process, the voltage and the temperature.

The second write voltage providing unit 10*b* may provide a voltage to the word line included in the memory device 70. In the case that the current that is greater than a predetermined amount of current is transferred to the magnetic tunnel junction element, the magnetic tunnel junction element may break down. The amplitude of the current at which the magnetic tunnel junction element breaks down may be a breakdown current. To prevent the breakdown of the memory cell, a constant amplitude of the current that is less than the breakdown current may be transferred to the magnetic tunnel junction element. The second write voltage providing unit 10*b* may be used to provide a constant amplitude of the current that is less than the breakdown current to the magnetic tunnel junction element.

For example, the magnetic tunnel junction element included in the second write voltage providing unit 10*b* may be identical to the magnetic tunnel junction element 21 included in the memory cell. The transistor switch of the second transistor switch unit 530*b* included in the second write voltage providing unit 10*b* may be identical to the transistor switch 22 included in the memory cell. In this case, the second write voltage VW2 may be transferred to the gate of the transistor switch 22 included in the memory cell. The second comparison voltage providing unit 500*b* may be identical to the memory cell. Therefore, the amplitude of the current between the magnetic tunnel junction element included in the second write voltage providing unit 10*b* and the transistor switch included in the second write voltage providing unit 10*b* may be identical to the amplitude of the current between the magnetic tunnel junction element 21 included in the memory cell and the transistor switch 22 included in the memory cell.

If the second write voltage providing unit 10*b* according to example embodiments is used, the amplitude of the current between the second magnetic tunnel junction unit 510*b* included in the second write voltage providing unit 10*b* and the second transistor switch unit 530*b* included in the second write voltage providing unit 10*b* may be constant regardless of the process, the voltage and the temperature. If the amplitude of the current between the second magnetic tunnel junction unit 510*b* included in the second write voltage providing unit 10*b* and the second transistor switch unit 530*b* included in the second write voltage providing unit 10*b* is a constant, the amplitude of the current between the magnetic tunnel junction element 21 included in the memory cell and the transistor switch 22 included in the memory cell may be constant. Therefore, if the second write voltage providing unit 10*b* according to example embodiments is used, the constant amplitude of the current that is less than the break down current may be transferred to the magnetic tunnel junction element. If the constant amplitude of the current that is less than the breakdown current is transferred to the magnetic tunnel junction element, the breakdown of the memory cell may be prevented.

In an example embodiment, in the case that the memory cell is written from a first state P-STATE to a second state AP-STATE, the write voltage providing unit may output the first write voltage VW1. In the case that the memory cell is written from the second state AP-STATE to the first state P-STATE, the write voltage providing unit may output the second write voltage VW2.

For example, the magnetic tunnel junction element 21 included in the memory cell may include a first layer 516*b*, a second layer 517*b* and a third layer 518*b*. Spin directions of the first layer 516*b* and the third layer 518*b* included in the magnetic tunnel junction element may be the same based on the direction of current transferred to the magnetic tunnel junction element. A state in which the spin directions of the first layer 516*b* and the third layer 518*b* are the same may be a first state P-STATE. A state in which the spin directions of the first layer 516b and the third layer 518b are different may be a second state AP-STATE.

In an example embodiment, in the case that the memory device 70 operates in read mode, the read voltage applied to the local word line LWL may be provided from the second write voltage providing unit 10b.

Figure 24:
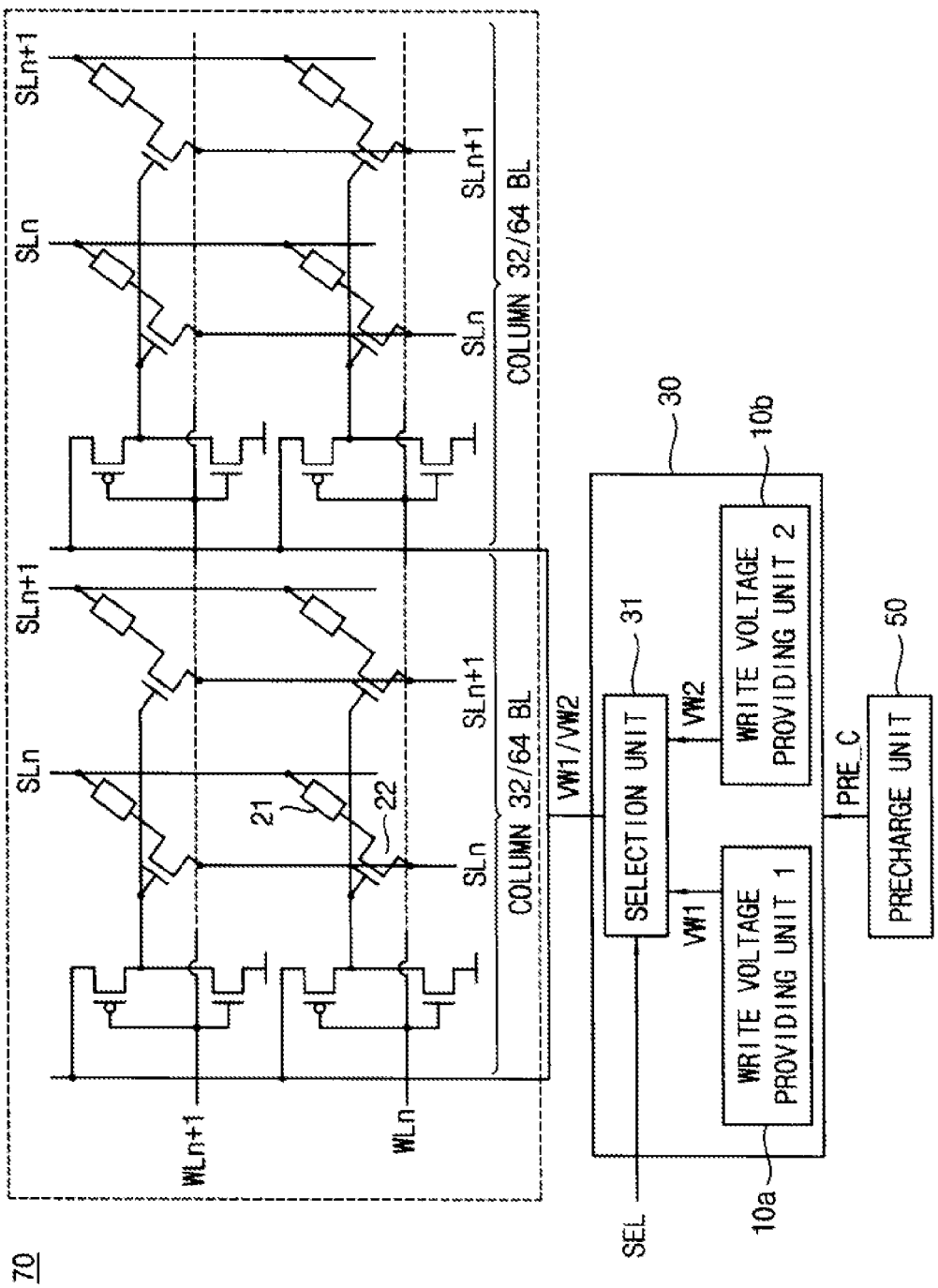
FIG. 24 is a diagram illustrating a memory device according to example embodiments.

FIG. 24 is a diagram illustrating a memory device according to example embodiments.

Referring to FIGS. 1, 11 and 24, a memory device 70 includes a memory cell array 20 and a write voltage providing unit. The write voltage providing unit includes a first write voltage providing unit 10a and a second write voltage providing unit 10b. The memory cell array 20 includes memory cells connected between a plurality of bit lines and a plurality of source lines. Each of the memory cells includes a switch transistor where a local word line LWL is connected to gate. The write voltage providing unit provides a first write voltage VW1 or a second write voltage VW2 to a corresponding local word line LWL when a global word line GWL is enabled. The first write voltage VW1 is outputted from a first write voltage providing unit 10a. The second write voltage VW2 is outputted from a second write voltage providing unit 10b. A selection unit may select the first write voltage VW1 or the second write voltage VW2 based on a selection signal.

The first write voltage providing unit 10a includes a first reference voltage providing unit 100a, a first comparison voltage providing unit 500a and a first comparison unit 300a. The first reference voltage providing unit 100a may include a first reference element 110a and a first current source 130a series-connected between a power supply voltage VDD and a ground voltage VSS. The first reference voltage providing unit 100a outputs a first reference voltage VR1 through a first reference voltage node N_VR1. The first reference voltage node N_VR1 connects the first reference element 110a to the first current source 130a. The first comparison voltage providing unit 500a includes a first magnetic tunnel junction unit 510a connected between the power supply voltage VDD and a first comparison voltage node N_VC1 and a first transistor switch unit 530a connected between the ground voltage VSS and the first comparison voltage node N_VC1. The first comparison voltage providing unit 500a outputs a first comparison voltage VC1 through the first comparison voltage node N_VC1. The first comparison unit 300a provides a first write voltage VW1 to the first transistor switch unit 530a by comparing the first reference voltage VR1 and the first comparison voltage VC1.

The second write voltage providing unit 10b includes a second reference voltage providing unit 100b, a second comparison voltage providing unit 500b and a second comparison unit. The second reference voltage providing unit 100b includes a second current source 130b connected between a power supply voltage VDD and a second reference voltage node N_VR2 and a second reference element 110b connected between the second reference voltage node N_VR2 and a ground voltage VSS. The second reference voltage providing unit 100b outputs a second reference voltage VR2 through the second reference voltage node N_VR2. The second comparison voltage providing unit 500b includes a second transistor switch unit 530b connected between the power supply voltage VDD and a second comparison voltage node N_VC2 and a second magnetic tunnel junction unit 510b connected between the ground voltage VSS and the second comparison voltage node N_VC2. The second comparison voltage providing unit 500b outputs a second comparison voltage VC2 through the second comparison voltage node N_VC2. The second comparison unit provides a second write voltage VW2 to the second transistor switch unit 530b by comparing the second reference voltage VR2 and the second comparison voltage VC2.

In an example embodiment, the memory device 70 may further comprise a precharge unit that precharges the first magnetic tunnel junction unit 510a and the second magnetic tunnel junction unit 510b. For example, the precharge unit may precharge the first magnetic tunnel junction unit 510a as the first state P-STATE in which the spin directions of the first layer 516b and the third layer 518b are same. Also, the precharge unit may precharge the second magnetic tunnel junction unit 510b as the second state AP-STATE in which the spin directions of the first layer 516b and the third layer 518b are different.

Figure 25:
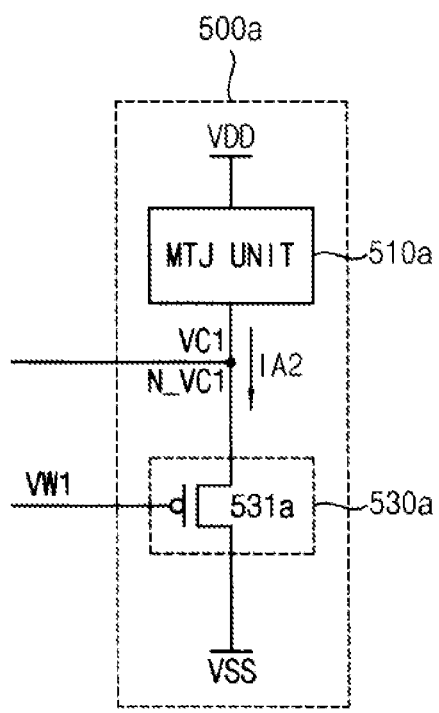
FIG. 25 is a diagram illustrating an example of a first comparison voltage providing unit included in a first write voltage providing unit of FIG. 21.
Figure 26:
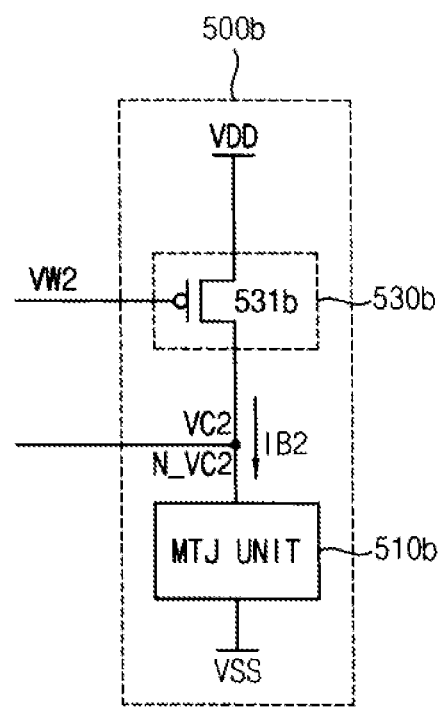
FIG. 26 is a diagram illustrating an example of a second comparison voltage providing unit included in a second write voltage providing unit of FIG. 21.

FIG. 25 is a diagram illustrating an example of a first comparison voltage providing unit included in a first write voltage providing unit of FIG. 21 and FIG. 26 is a diagram illustrating an example of a second comparison voltage providing unit included in a second write voltage providing unit of FIG. 21.

Referring to FIGS. 25 and 26, transistor switches included in the first transistor switch unit 530a and the second transistor switch unit 530b may be n-mos transistors or p-mos transistors. A magnetic tunnel junction element 21 included in the memory cell may be identical with a magnetic junction element included in the first magnetic tunnel junction unit 510a and the second magnetic tunnel junction unit 510b. A transistor switch 22 included in the memory cell may be identical with a transistor switch included in the first transistor switch unit 530a and the second transistor switch unit 530b. For example, in the case that the transistor switch 22 included in the memory cell is a p-mos transistor, the transistor switch included in the first transistor switch unit 530a may be a p-mos transistor and the transistor switch included in the second transistor switch unit 530b may be a p-mos transistor. Also, in the case that the transistor switch 22 included in the memory cell is an n-mos transistor, the transistor switch included in the first transistor switch unit 530a may be an n-mos transistor and the transistor switch included in the second transistor switch unit 530b may be an n-mos transistor.

Figure 27:
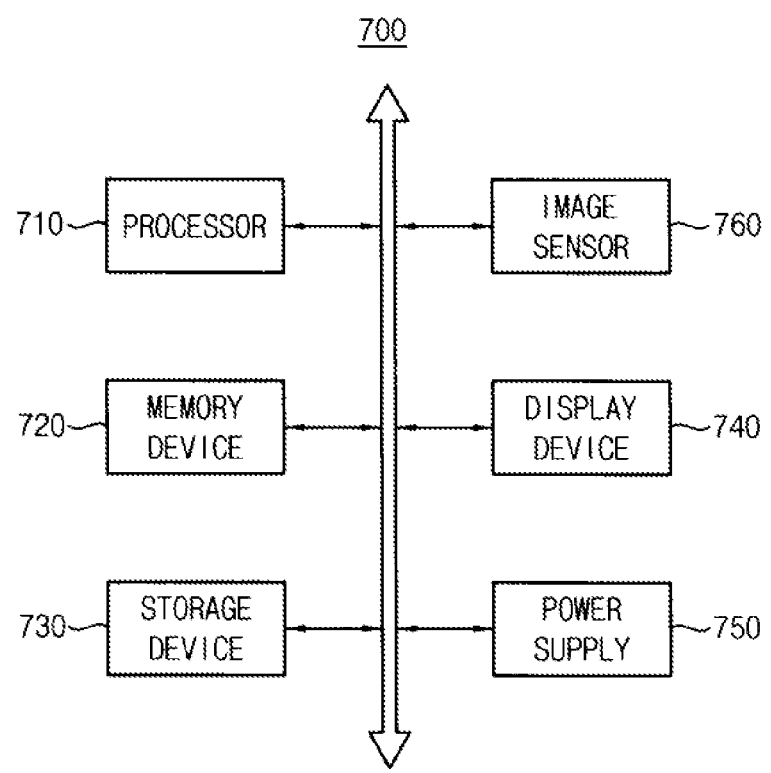
FIG. 27 is a block diagram illustrating a mobile device including the memory module according to example embodiments.

FIG. 27 is a block diagram illustrating a mobile device including the memory module according to example embodiments.

Referring to FIG. 27, a mobile device 700 may include a processor 710, a memory device 720, a storage device 730, a display device 740, a power supply 750 and an image sensor 760. The mobile device 700 may further include ports that communicate with a video card, a sound card, a memory card, a USB device, other electronic devices, etc.

The processor 710 may perform various calculations or tasks. According to embodiments, the processor 710 may be a microprocessor or a CPU. The processor 710 may communicate with the memory device 720, the storage device 730, and the display device 740 via an address bus, a control bus, and/or a data bus. In some embodiments, the processor 710 may be coupled to an extended bus, such as a peripheral component interconnection (PCI) bus. The memory device 720 may store data for operating the mobile device 700. For example, the memory device 720 may be implemented with a dynamic random access memory (DRAM) device, a mobile DRAM device, a static random access memory (SRAM) device, a phase-change random access memory (PRAM) device, a ferroelectric random access memory (FRAM) device, a resistive random access memory (RRAM) device, and/or a magnetic random access memory (MRAM) device. The memory device 720 includes the a magnetic random access memory (MRAM) according to example embodiments disclosed herein. The storage device 730 may include a solid-state drive (SSD), a hard disk drive (HDD), a CD-ROM, etc. The display device 740 may comprise a touch-screen display. The mobile device 700 may further include an input device (not shown), such as a touchscreen different from display device 740, a keyboard, a keypad, a mouse, etc., and an output device, such as a printer, a display device, etc. The power supply 750 supplies operation voltages for the mobile device 700.

The image sensor 760 may communicate with the processor 710 via the buses or other communication links. The image sensor 760 may be integrated with the processor 710 in one chip, or the image sensor 760 and the processor 710 may be implemented as separate chips.

At least a portion of the mobile device 700 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP). The mobile device 700 may be a digital camera, a mobile phone, a smart phone, a portable multimedia player (PMP), a personal digital assistant (PDA), a computer, etc.

Figure 28:
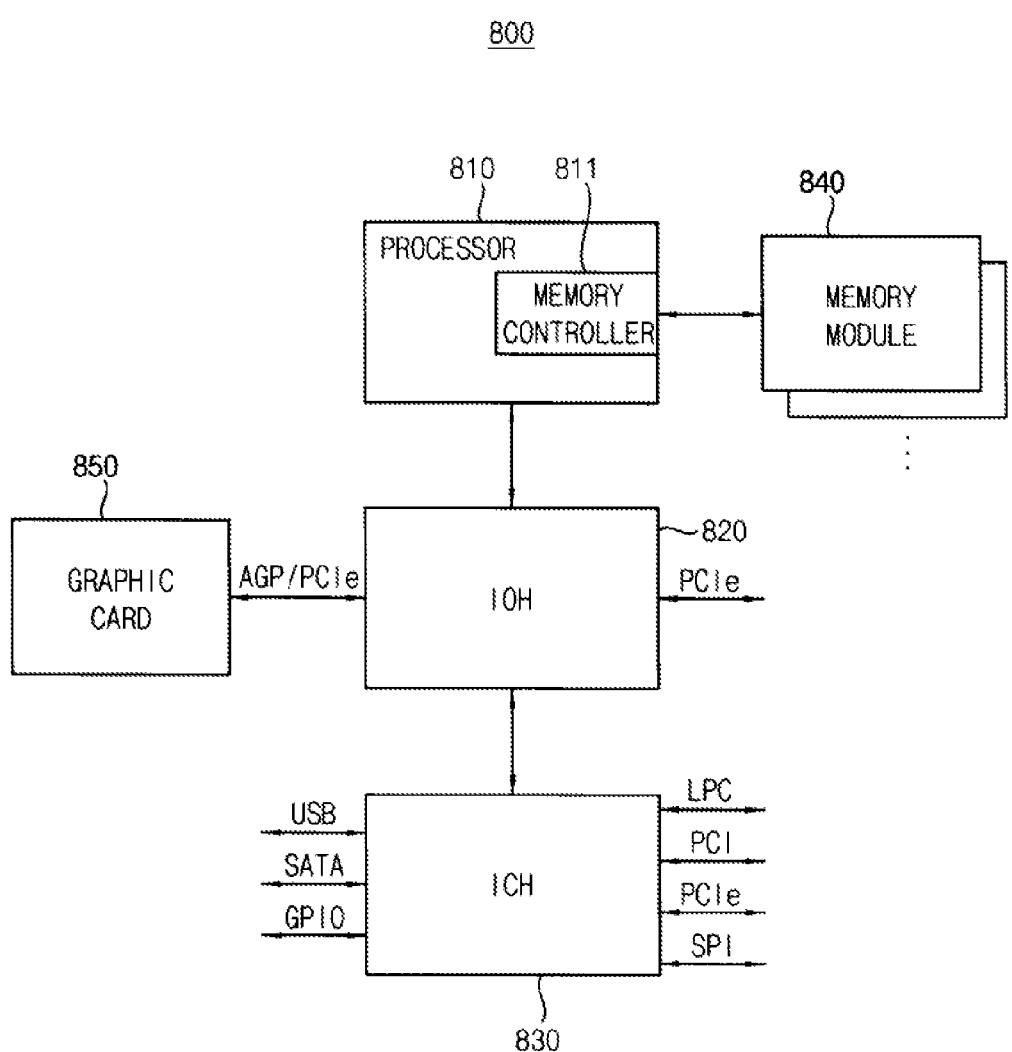
FIG. 28 is a block diagram illustrating a computing system including the memory module according to example embodiments.

FIG. 28 is a block diagram illustrating a computing system including the memory module according to example embodiments.

Referring to FIG. 28, a computing system 800 includes a processor 810, an input/output hub (IOH) 820, an input/output controller hub (ICH) 830, at least one memory module 840 and a graphics card 850. In some embodiments, the computing system 800 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 810 may perform various computing functions, such as executing specific software for performing specific calculations or tasks. For example, the processor 810 may be a microprocessor, a central process unit (CPU), a digital signal processor, or the like. In some embodiments, the processor 810 may include a single core or multiple cores. For example, the processor 810 may be a multi-core processor, such as a dual-core processor, a quad-core processor, a hexa-core processor, etc. In some embodiments, the computing system 800 may include a plurality of processors. The processor 810 may include an internal or external cache memory.

The processor 810 may include a memory controller 811 for controlling operations of the memory module 840. The memory controller 811 included in the processor 810 may be referred to as an integrated memory controller (IMC). A memory interface between the memory controller 811 and the memory module 840 may be implemented with a single channel including a plurality of signal lines, or may bay be implemented with multiple channels, to each of which at least one memory module 840 may be coupled. In some embodiments, the memory controller 811 may be located inside the input/output hub 820, which may be referred to as memory controller hub (MCH).

The input/output hub 820 may manage data transfer between processor 810 and devices, such as the graphics card 850. The input/output hub 820 may be coupled to the processor 810 via various interfaces. For example, the interface between the processor 810 and the input/output hub 820 may be a front side bus (FSB), a system bus, a HyperTransport, a lightning data transport (LDT), a QuickPath interconnect (QPI), a common system interface (CSI), etc. In some embodiments, the computing system 800 may include a plurality of input/output hubs. The input/output hub 820 may provide various interfaces with the devices. For example, the input/output hub 820 may provide an accelerated graphics port (AGP) interface, a peripheral component interface-express (PCIe), a communications streaming architecture (CSA) interface, etc.

The graphics card 850 may be coupled to the input/output hub 820 via AGP or PCIe. The graphics card 850 may control a display device (not shown) for displaying an image. The graphics card 850 may include an internal processor for processing image data and an internal memory device. In some embodiments, the input/output hub 820 may include an internal graphics device along with or instead of the graphics card 850 outside the graphics card 850. The graphics device included in the input/output hub 820 may be referred to as integrated graphics. Further, the input/output hub 820 including the internal memory controller and the internal graphics device may be referred to as a graphics and memory controller hub (GMCH).

The input/output controller hub 830 may perform data buffering and interface arbitration to efficiently operate various system interfaces. The input/output controller hub 830 may be coupled to the input/output hub 820 via an internal bus, such as a direct media interface (DMI), a hub interface, an enterprise Southbridge interface (ESI), PCIe, etc. The input/output controller hub 830 may provide various interfaces with peripheral devices. For example, the input/output controller hub 830 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 810, the input/output hub 820 and the input/output controller hub 830 may be implemented as separate chipsets or separate integrated circuits. In other embodiments, at least two of the processor 810, the input/output hub 820 and the input/output controller hub 830 may be implemented as a single chipset.

The present inventive concept may be applied to systems such as be a mobile phone, a smart phone, a personal digital assistant (PDA), a portable multimedia player (PMP), a digital camera, a music player, a portable game console, a navigation system, etc. The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims.

What is claimed is:
1. A voltage generator, comprising:
a reference voltage providing unit comprising a reference element and a current source, the reference element and the current source being series-connected between a power supply voltage and a ground voltage, the reference voltage providing unit being configured to output a reference voltage through a reference voltage node, and the reference voltage node connecting the reference element to the current source;

a comparison voltage providing unit comprising a magnetic tunnel junction unit and a transistor switch unit, the magnetic tunnel junction being coupled between the power supply voltage and a comparison voltage node and the transistor switch unit being coupled between the ground voltage and the comparison voltage node, the comparison voltage providing unit being configured to output a comparison voltage through the comparison voltage node; and a comparison unit configured to provide a write voltage to the transistor switch unit by comparing the reference voltage and the comparison voltage.

2. The voltage generator of claim 1, wherein an amplitude of a current between the magnetic tunnel junction unit and the transistor switch unit is determined based on an amplitude of a current of the current source.

3. The voltage generator of claim 1,
wherein the magnetic tunnel junction unit comprises a plurality of magnetic tunnel junction elements each coupled between the power supply voltage and the comparison voltage node, and
wherein the transistor switch unit comprises a plurality of transistor switches each coupled between the ground voltage and the comparison voltage node.

4. The voltage generator of claim 3,
wherein the voltage generator further comprises control switches that selectively couple the magnetic tunnel junction elements and the transistor switches to the comparison voltage node.

5. The voltage generator of claim 3,
wherein an amplitude of the current between the magnetic tunnel junction unit and the transistor switch unit is less than an amplitude of a breakdown current of the magnetic junction elements.

6. The voltage generator of claim 4,
wherein the control switches are controlled based on temperature.

7. The voltage generator of claim 1,
wherein a magnetic tunnel junction element included in the magnetic tunnel junction unit is precharged as a first state comprising spin directions of a first layer and a third layer of the magnetic tunnel junction element are a same spin direction.

8. The voltage generator of claim 1,
wherein the reference element comprises a resistor element, a magnetic tunnel junction element or a voltage source.

9. The voltage generator of claim 1,
wherein the reference voltage is determined based on an amplitude of a current of the current source.

10. The voltage generator of claim 9,
wherein the reference voltage increases as the amplitude of the current of the current source decreases, and the reference voltage decreases as the amplitude of the current of the current source increases.

11. The voltage generator of claim 9,
wherein the write voltage changes as the reference voltage changes.

12. A voltage generator, comprising:
a reference voltage providing unit comprising a current source and a reference element, the current source being coupled between a power supply voltage and a reference voltage node and the reference element being coupled between the reference voltage node and a ground voltage, the reference voltage providing unit being configured to output a reference voltage through the reference voltage node;

a comparison voltage providing unit comprising a transistor switch unit and a magnetic tunnel junction unit, the transistor switch unit being coupled between the power supply voltage and a comparison voltage node and the magnetic tunnel junction unit being coupled between the ground voltage and the comparison voltage node, the comparison voltage providing unit being configured to output a comparison voltage through the comparison voltage node; and a comparison unit configured to provide a write voltage to the transistor switch unit by comparing the reference voltage and the comparison voltage.

13. The voltage generator of claim 12,
wherein an amplitude of a current between the magnetic tunnel junction unit and the transistor switch unit is determined based on an amplitude of current of the current source.

14. The voltage generator of claim 12,
wherein the magnetic tunnel junction unit comprises a plurality of magnetic tunnel junction elements each connected between the ground voltage and the comparison voltage node,
wherein the transistor switch unit comprises a plurality of transistor switches each coupled between the power supply voltage and the comparison voltage node, and
wherein control switches selectively couple the magnetic tunnel junction elements and the transistor switches to the comparison voltage node.

15. The voltage generator of claim 14,
wherein an amplitude of the current between the magnetic tunnel junction unit and the transistor switch unit is less than an amplitude of a breakdown current of the magnetic junction elements.

16. The voltage generator of claim 12,
wherein a magnetic tunnel junction element included in the magnetic tunnel junction unit is precharged as a second state in which spin directions of a first layer and a third layer of the magnetic tunnel junction element are different.

17. A memory device, comprising:
a memory cell array comprising memory cells that are coupled between a plurality of bit lines and a plurality of source lines, each of the memory cells comprising a switch transistor where a local word line is coupled to gate; and
a write voltage generating unit configured to provide a first write voltage or a second write voltage to a corresponding local word line when a global word line is enabled, the first write voltage being output from a first write voltage providing unit, the second write voltage being output from a second write voltage providing unit,
the first write-voltage providing unit comprising:
a first reference voltage providing unit comprising a first reference element and a first current source, the first reference element and the first current source being series-connected between a power supply voltage and a ground voltage, the first reference voltage providing unit being configured to output a first reference voltage through a first reference voltage node, and the first reference voltage node connecting the first reference element to the first current source;
a first comparison voltage providing unit comprising a first magnetic tunnel junction unit and a first transistor switch unit, the first magnetic tunnel junction unit being coupled between the power supply voltage and a first comparison voltage node, the first transistor switch unit being coupled between the ground voltage and the first comparison voltage node, and the first comparison voltage providing unit being configured to output a first comparison voltage through the first comparison voltage node; and a first comparison unit configured to provide a first write voltage to the first transistor switch unit by comparing the first reference voltage and the first comparison voltage, and the second write-voltage providing unit comprising:

a second reference voltage providing unit comprising a second current source and a second reference element, the second current source being coupled between a power supply voltage and a second reference voltage node, the second reference element being coupled between the second reference voltage node and a ground voltage, and the second reference voltage providing unit being configured to output a second reference voltage through the second reference voltage node;

a second comparison voltage providing unit comprising a second transistor switch unit and a second magnetic tunnel junction unit, the second transistor switch unit being coupled between the power supply voltage and a second comparison voltage node, the second magnetic tunnel junction unit being coupled between the ground voltage and the second comparison voltage node, and the second comparison voltage providing unit configured to output a second comparison voltage through the second comparison voltage node; and a second comparison unit configured to provide a second write voltage to the second transistor switch unit by comparing the second reference voltage and the second comparison voltage.

18. The memory device of claim 17, wherein, in a case in which a memory cell is written from a first state to a second state, the write voltage providing unit outputs the first write voltage, and wherein, in a case in which the memory cell is written from the second state to the first state, the write voltage providing unit outputs the second write voltage.

19. The memory device of claim 18, wherein transistor switches included in the first transistor switch unit and the second transistor switch unit are n-mos transistors or p-mos transistors, wherein a magnetic tunnel junction element included in a memory cell is substantially identical with a magnetic junction element included in the first magnetic tunnel junction unit and the second magnetic tunnel junction unit, and wherein a transistor switch included in the memory cell is substantially identical with a transistor switch included in the first transistor switch unit and the second transistor switch unit.

20. The memory device of claim 17, wherein the memory device further comprises a precharge unit that precharges the first magnetic tunnel junction unit and the second magnetic tunnel junction unit.

\* \* \* \* \*